(12) United States Patent
Moon et al.

(10) Patent No.: US 7,813,183 B2
(45) Date of Patent: Oct. 12, 2010

(54) PROGRAM AND ERASE METHODS FOR NONVOLATILE MEMORY

(75) Inventors: Seunghyun Moon, Seoul (KR); Kihwan Choi, Gyeonggi-do (KR); Jaesung Sim, Gyeonggi-do (KR); Jungdal Choi, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 226 days.

(21) Appl. No.: 12/119,060

(22) Filed: May 12, 2008

(65) Prior Publication Data

US 2008/0291737 A1 Nov. 27, 2008

(30) Foreign Application Priority Data

May 25, 2007 (KR) .................. 10-2007-0050963

(51) Int. Cl.
G11C 16/04 (2006.01)
(52) U.S. Cl. .................. 365/185.28; 365/185.19; 365/185.27
(58) Field of Classification Search ............. 365/185.28
See application file for complete search history.

(56) References Cited

U.S. PATENT DOCUMENTS

| | | | |
|---|---|---|---|
| 5,978,274 A | 11/1999 | Wang | |
| 6,567,312 B1 | 5/2003 | Torii et al. | |
| 6,687,158 B2 | 2/2004 | Yano | |
| 6,853,585 B2* | 2/2005 | Lee et al. | 365/185.22 |
| 6,888,757 B2 | 5/2005 | Lusky et al. | |
| 7,072,214 B2 | 7/2006 | Jeong et al. | |
| 7,099,196 B2* | 8/2006 | Suh et al. | 365/185.22 |
| 7,133,313 B2 | 11/2006 | Shih | |
| 7,286,413 B2* | 10/2007 | Jeong et al. | 365/185.28 |
| 7,602,648 B2* | 10/2009 | Lee | 365/185.19 |
| 2007/0036001 A1 | 2/2007 | Kanda et al. | |

FOREIGN PATENT DOCUMENTS

| | | |
|---|---|---|
| JP | 07-169287 | 7/1995 |
| JP | 09-180480 | 7/1997 |
| JP | 11/031391 | 2/1999 |
| JP | 2003-173690 | 6/2003 |
| JP | 2005-092923 | 4/2005 |
| JP | 2005-317191 | 11/2005 |
| JP | 2005-327435 | 11/2005 |
| KR | 10-2000-0049174 | 7/2000 |
| KR | 10-2001-0007511 | 1/2001 |
| KR | 2001-0065142 | 7/2001 |
| KR | 2001-0108656 | 12/2001 |
| KR | 2003-0096296 | 12/2003 |
| KR | 2004-0008526 | 1/2004 |
| KR | 2005-0055197 | 6/2005 |
| KR | 2005-0106277 | 11/2005 |
| KR | 2006-012382 | 1/2006 |
| KR | 2007-0002411 | 1/2007 |

* cited by examiner

Primary Examiner—Son L Mai
(74) Attorney, Agent, or Firm—Harness, Dickey & Pierce, P.L.C.

(57) ABSTRACT

Methods of programming or erasing a nonvolatile memory device having a charge storage layer including performing at least one unit programming or erasing loop, each unit programming or erasing loop including applying a programming pulse, an erasing pulse, a time delay, a soft erase pulse, soft programming pulse and/or a verifying pulse as a positive or negative voltage to a portion (for example, a word line or a substrate) of the nonvolatile memory device.

25 Claims, 26 Drawing Sheets

(S.E:Soft Program)

(T.D:Time Delay)

(T.D:Time Delay)

(S.P:Soft Program)

PROGRAM AND ERASE METHODS FOR NONVOLATILE MEMORY

PRIORITY STATEMENT

This application claims priority under 35 U.S.C. §119 to Korean Patent Application No. 10-2007-0050963 filed on May 25, 2007, the contents of which are herein incorporated by reference in their entirety for all purposes.

BACKGROUND

1. Field

Methods of programming or erasing a nonvolatile memory device having a charge storage layer, for example, including performing at least one unit programming or erasing loop, each unit programming or erasing loop including applying a programming pulse, an erasing pulse, a time delay, a soft erase pulse, soft programming pulse and/or a verifying pulse as a positive or negative voltage to a portion (for example, a word line or a substrate) of the nonvolatile memory device.

2. Description of the Related Art

Non-volatile memory retains information stored in its memory cells even when no power is supplied. Examples include mask ROM, EPROM, and EEPROM.

Non-volatile memory is widely used in various kind of electronic products, for example, personal computers, personal digital assistants (PDAs), cellular phones, digital still cameras, digital video cameras, video game players, memory cards, and other electronic devices.

Memory cards types may include multimedia cards (MMC), secure digital (SD) cards, compact flash cards, memory sticks, smart media cards, and extreme digital (xD) picture cards.

Among non-volatile memory devices, a flash memory is widely used. Flash memory may be divided into a Not-OR (NOR) type and a Not-AND (NAND) type based on a connection structure of cells and bit lines. Because a read speed is faster and a write operation is slower, a NOR-type flash memory may be used as a code memory. Because a write speed is faster and a price per unit area is lower, a NAND-type flash memory may be used as a mass storage device.

NOR-type flash memory may be used in BIOS/networking in a PC, a router, or a hub or in a telecommunications switcher. NOR-type flash memory may also be used to store code or data for cellular phones, personal digital assistants (PDAs), POS, or PCA.

NAND-type flash memory may be used in memory cards for mobile computers, digital cameras, both still and moving, near-CD quality voice and audio recorders, rugged and reliable storage, for example, solid-state disks.

FIG. 1 illustrates a conventional program loop including a plurality of unit program loops using an ISPP method. As illustrated in FIG. 1, one unit program loop may include a program operation and a verify read operation. In the program operation, a program voltage Vpgm may be applied to a selected word line and a pass voltage Vpass may be applied to the unselected word lines. In the verify read operation, a verify voltage Vvfy may be applied to the selected word line and a read voltage Vread may be applied to the unselected word lines. In conventional ISPP fashion, the program voltage Vpgm may be increased by a delta voltage $\Delta V$ for each unit program loop.

Similarly, FIG. 2 illustrates a conventional erase loop including a plurality of unit erase loops using an ISPP method. An erase loop may include an erase operation and a verify read operation. The erase operation may include the application of an erase voltage Vers to the substrate of a selected block. The verify read operation may include the application of a verify voltage Vvfy to the selected word line and a read voltage Vread to the unselected word lines. In conventional ISPP fashion, the erase voltage Vers may increase by a delta voltage $\Delta V$ for each unit erase loop.

SUMMARY

Example embodiments are directed to methods of programming or erasing a nonvolatile memory device having a charge storage layer including performing at least one unit programming or erasing loop, each unit programming or erasing loop including applying a programming pulse, an erasing pulse, a time delay, a soft erase pulse, soft programming pulse and/or a verifying pulse as a positive or negative voltage to a portion (for example, a word line or a substrate) of the nonvolatile memory device.

Example embodiments are directed to a method of programming a nonvolatile memory device having a charge storage layer, comprising performing at least one unit programming loop, each unit programming loop including applying a programming pulse to a word line, applying at least one of a time delay to the word line and a soft erase pulse to the nonvolatile memory device, and applying a verifying pulse to the word line.

Example embodiments are directed to a method of erasing a nonvolatile memory device having a charge storage layer, comprising performing at least one unit erasing loop, each unit erasing loop including applying an erasing pulse to a substrate of the nonvolatile memory device, applying at least one of a time delay to the substrate of the nonvolatile memory device and a soft programming pulse to the nonvolatile memory device, and applying a verifying pulse to a word line.

BRIEF DESCRIPTION OF THE DRAWINGS

The above and other features and advantages of example embodiments will become more apparent by describing them in detailed with reference to the accompanying drawings.

FIGS. 13A-23B illustrate an erase loop in accordance with example embodiments.

FIG. 14 illustrates a duration of the time delay operation in accordance with example embodiments.

FIG. 15 illustrates an erase loop in accordance with example embodiments.

FIG. 16 illustrates a duration of the time delay operation in accordance with example embodiments.

FIG. 18 illustrates an example of the direction of an electric field during an erase operation in accordance with example embodiments.

FIG. 19 illustrates a direction of an electric field for a soft program operation in accordance with example embodiments.

FIG. 20 illustrates example embodiments of a unit erase loop in more detail.

FIG. 21 illustrates a program or erase loop in accordance with example embodiments.

FIG. 22 illustrates a program or erase loop in accordance with example embodiments.

FIG. 23 illustrates a program or erase loop in accordance with example embodiments.

DETAILED DESCRIPTION

Figure 1:
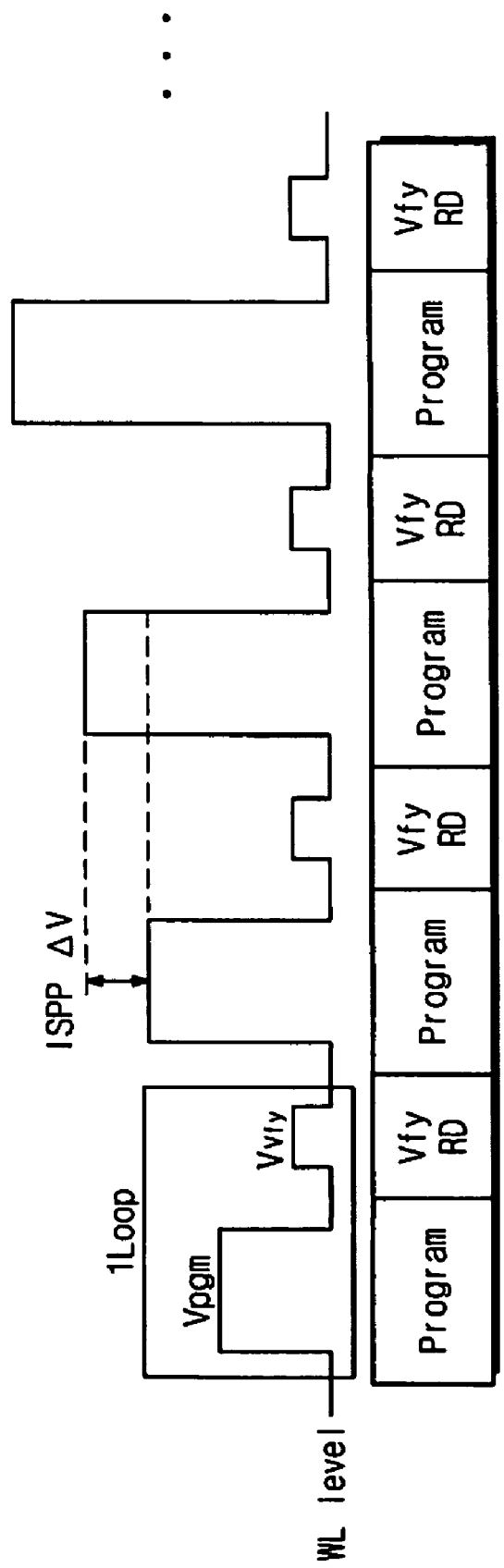
FIG. 1 illustrates and conventional program loop using an ISPP method.
Figure 2:
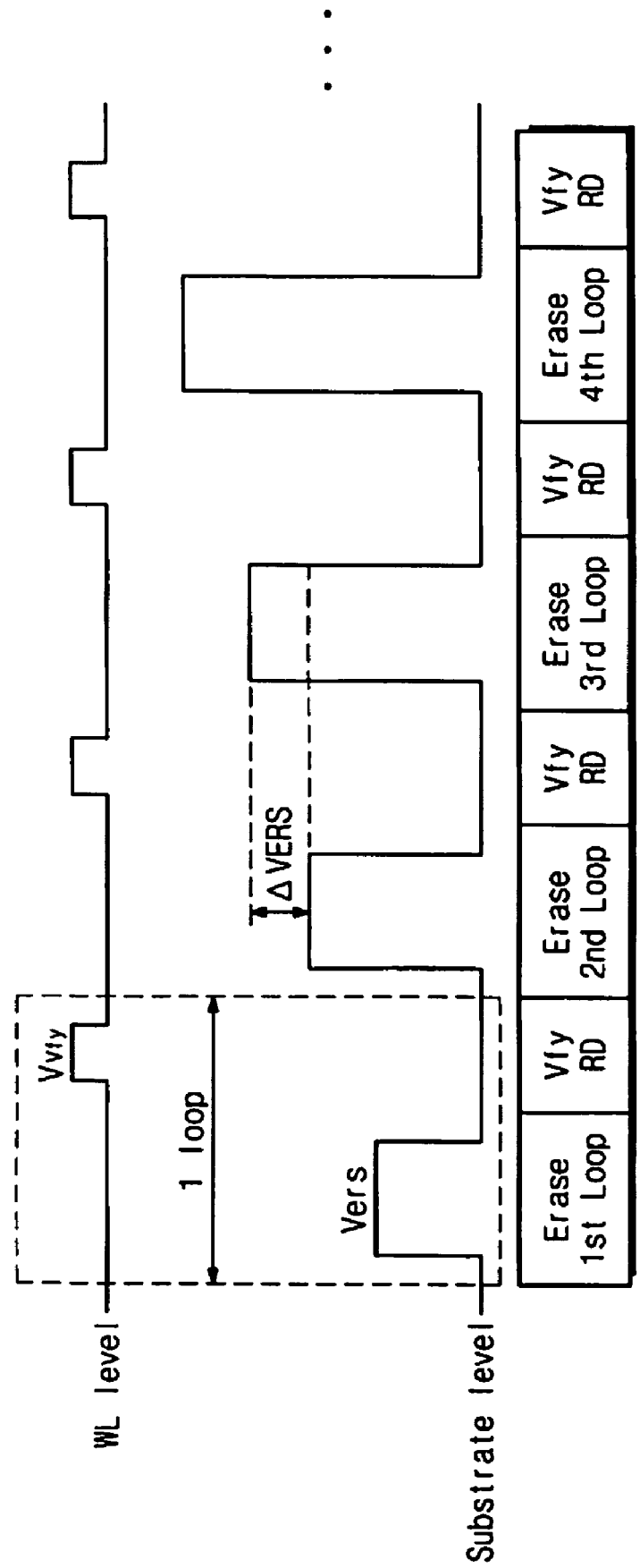
FIG. 2 illustrates a conventional erase loop using an ISPP method.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout. Example embodiments should not be construed as limited to the particular shapes of regions illustrated in these figures but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claims.

Figure 3:
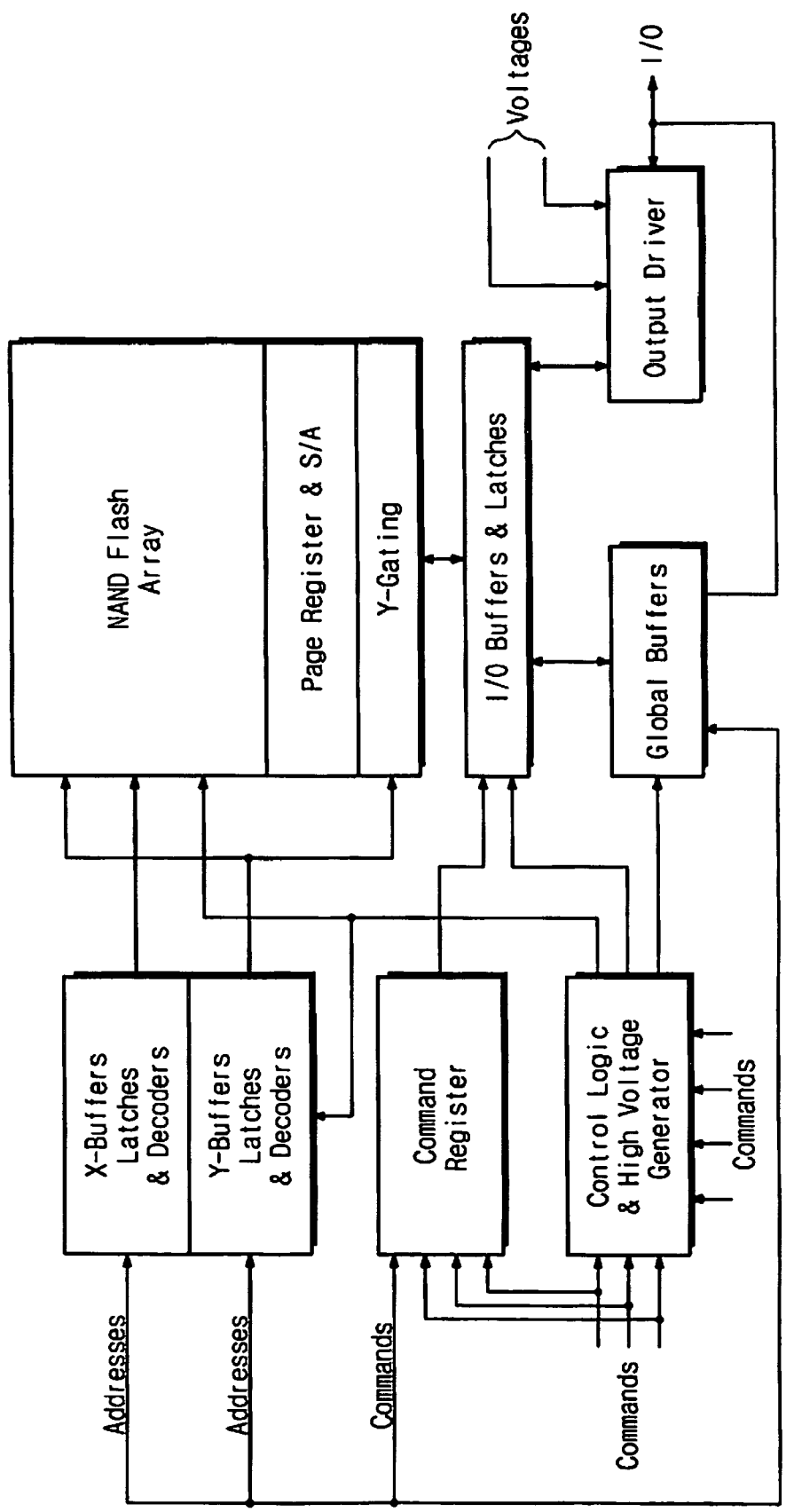
FIG. 3 illustrates a NAND flash memory block diagram in accordance with example embodiments.

FIG. 3 illustrates a NAND flash memory block diagram in accordance with example embodiments. As illustrated, a NAND flash memory may include a NAND flash array, which is accessed by X-buffers, latches, and decoders and X-buffers, latches, and decoders via a plurality of word lines and accessed by a page register and sense amplifier and Y-gating via a plurality of bit lines. The NAND flash memory may also include an output driver for receiving and sending signal externally, a command register and control logic and high voltage generator for receiving commends and sending commands to access the NAND flash array. The NAND flash memory may also include global buffers and I/O buffers and latches to control the access of data to and from the NAND flash array. It is noted that the specific structure of the NAND flash memory of FIG. 3 is an example, and any other structures or variants may also be used. The NAND flash array may also be of any desired size and arrangement.

Figure 4:
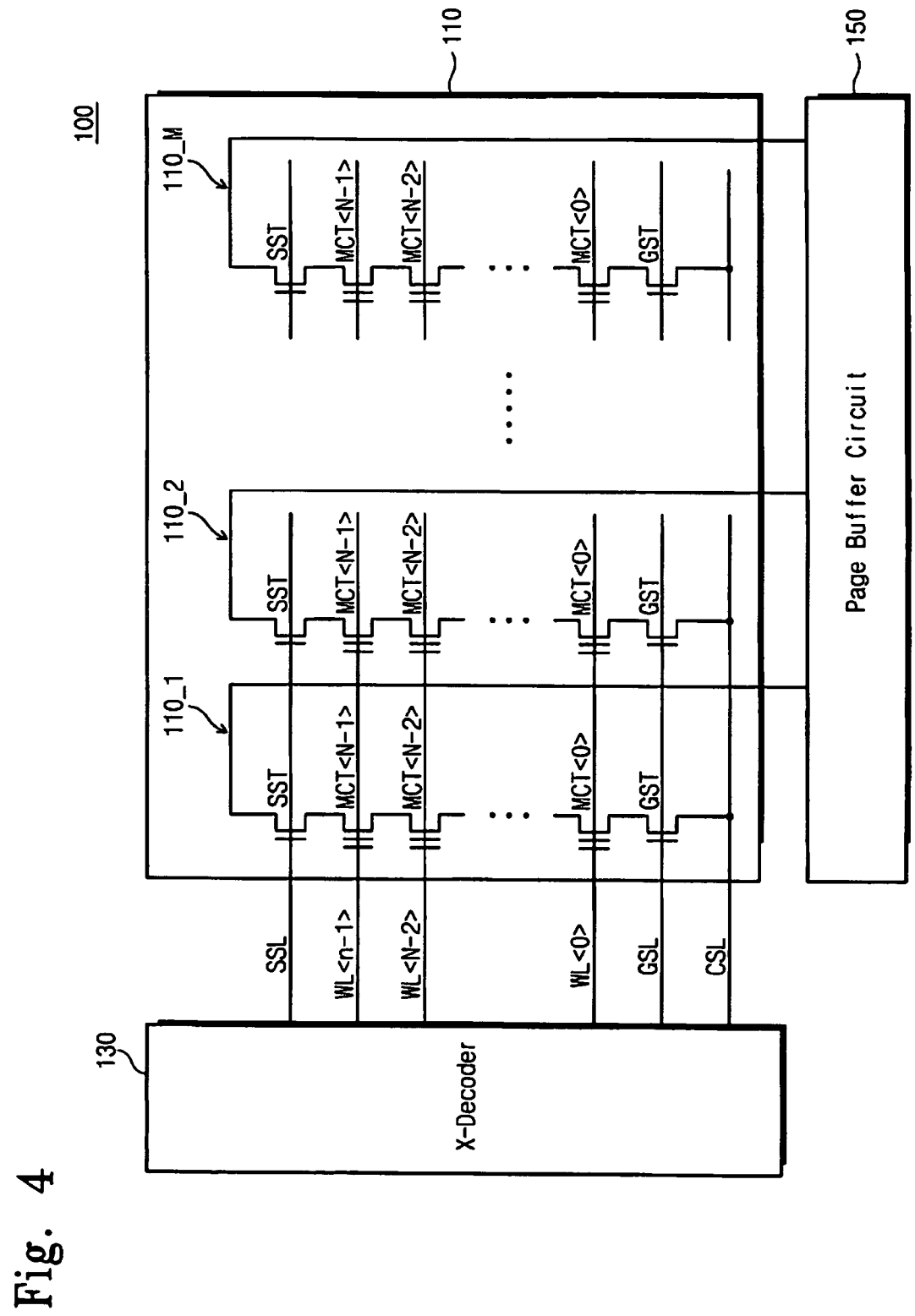
FIG. 4 illustrates the block of a NAND flash memory device in accordance with example embodiments in more detail.

FIG. 4 illustrates a portion of a block of a NAND flash memory device 100 in accordance with example embodiments in more detail. As illustrated in FIG. 4, an X-decoder 130 controls voltages of the various lines, including the word lines WL, the SSL lines, and the GSL lines, whereas a page buffer circuit 150 controls the voltage of the bit lines 110_1 . . . 110_M, for example, the even and odd bit lines. As shown, at the intersection of the SSL lines and the bit lines are string selection transistors SSTs. At the intersection of the GSL lines and the bit lines are ground selection transistors GSTs. At the intersection of the word lines WL lines and the bit lines are memory cell transistors MCT<0> . . . MCT<N−1> that make up the NAND flash array 110.

Figure 5A:
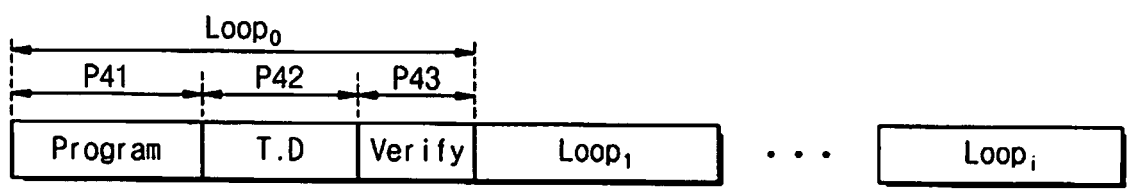
FIGS. 5A-5B illustrate a program loop in accordance with example embodiments.
Figure 5B:
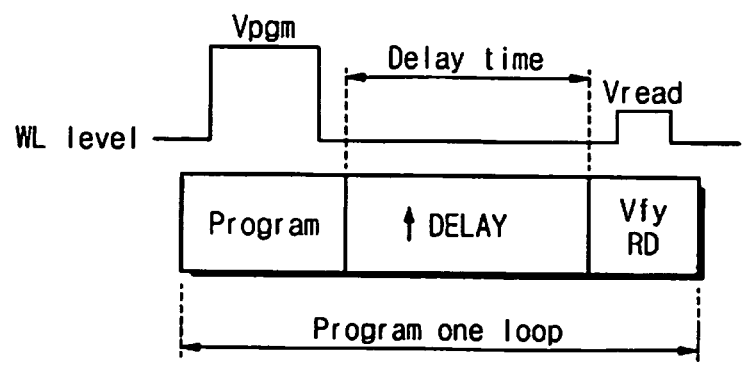

FIGS. 5A-5B illustrates a program loop in accordance with example embodiments. As illustrated in FIGS. 5A-5B, a program loop may include one or more program unit loops $Loop_i$ (where i is an integer $\geq 1$). As illustrated in FIGS. 5A-5B, each unit program $Loop_i$ may include a program operation P41, a time delay operation P42, and/or a verify read operation P43. In example embodiments, the time delay operation P42 is between the program operation P41 and the verify read operation P43. In example embodiments, the time delay operation P42 allows a time margin for charges in a charge trap layer to redistribute and/or recombine. In example embodiments, the threshold voltage Vth of program cells may be changed during the time delay operation P42.

As illustrated in FIG. 5B, the program operation P41 may be the application of a pulse of a positive program voltage Vpgm to a word line of a memory cell transistor and the verify read operation P43 may be the application of a pulse of a positive verify read voltage Vvfy to the word line of the memory cell transistor. In other example embodiments, the program operation P41 may be the application of a pulse of a negative program voltage Vpgm to the substrate of a memory cell transistor and the verify read operation P43 may be the application of a pulse of a negative verify read voltage Vvfy to the substrate of a memory cell transistor.

Figure 6:
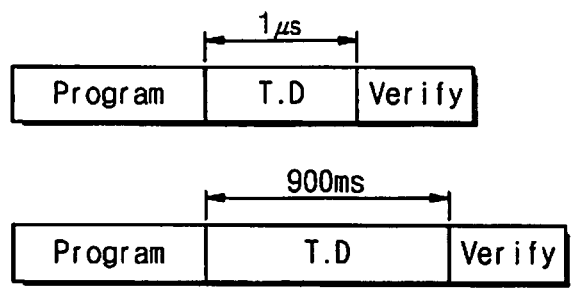
FIG. 6 illustrates a duration of the time delay operation in accordance with example embodiments.

As illustrated in FIG. 6, a duration of the time delay operation P42 may be on the order of 1 µsecond to 900 milliseconds, or any duration in between.

Figure 7:
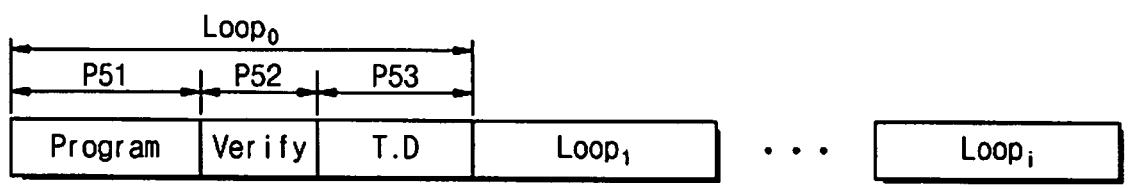
FIG. 7 illustrates a program loop in accordance with example embodiments.

FIG. 7 illustrates a program loop in accordance with example embodiments. As illustrated in FIG. 7, a program loop may include one or more unit program loops $Loop_i$ (where i is an integer $\geq 1$). In example embodiments illustrated in FIG. 7, each unit program loop $Loop_i$ may include a program operation P51, a time delay operation P52, and/or a verify read operation P53. In example embodiments, the time delay P52 may be after the program operation P51 and after the verify read operation P53. In example embodiments, the time delay operation P52 allows a time margin for charges in a charge trap layer to redistribute and/or recombine. In example embodiments, the threshold voltage Vth of program cells may be changed during the time delay operation P52.

Similar to FIG. 5B, the program operation P51 may be the application of a pulse of a positive program voltage Vpgm to the word line of a memory cell transistor and the verify read operation P53 may be the application of a pulse of a positive verify read voltage Vvfy to the word line of a memory cell transistor. Similar to FIG. 5B, the program operation P51 may be the application of a pulse of a negative program voltage Vpgm to the substrate of a memory cell transistor and the verify read operation P53 may be the application of a pulse of a negative verify read voltage Vvfy to the substrate of a memory cell transistor.

Figure 8:
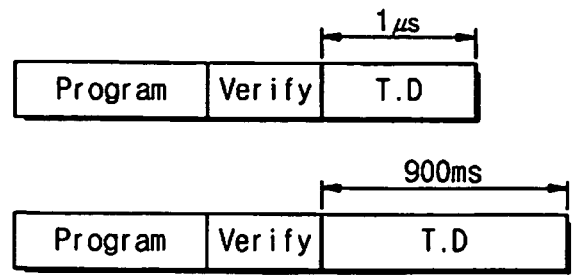
FIG. 8 illustrates a duration of the time delay operation in accordance with example embodiments.

As illustrated in FIG. 8, a duration of the time delay operation P52 may be on the order of 1 µsecond to 900 milliseconds, or any duration in between.

Figure 9A:
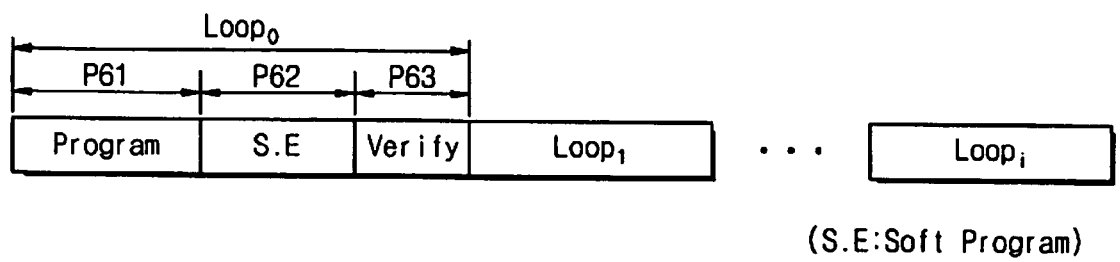
FIGS. 9A-9B illustrate a program loop in accordance with example embodiments.
Figure 9B:
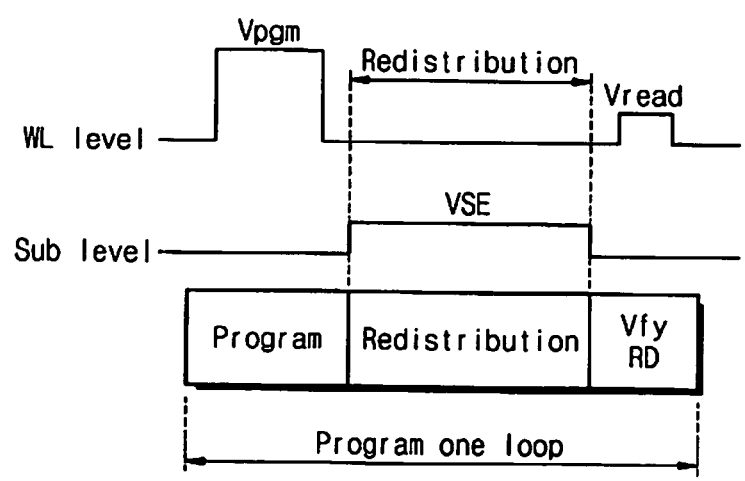

FIGS. 9A-9B illustrate a program loop in accordance with example embodiments. As illustrated in FIGS. 9A-9B, a program loop may include one or more unit program loops $Loop_i$ (where i is an integer $\geq 1$). In example embodiments illustrated in FIGS. 9A-9B, each unit program loop $Loop_i$ may include a program operation P61, a soft erase operation P62, and/or a verify read operation P63. In example embodiments, the soft erase operation P62 may be between the program operation P61 and the verify read operation P63. In example embodiments, the soft erase operation P62 accelerates charges in a charge trap layer to redistribute and/or recombine. In example embodiments, a voltage (or electric field) provided in the soft erase operation P62 may be smaller than a voltage (or electric field) provided in the program operation P61.

As illustrated in FIG. 9B, the program operation P61 may be the application of a pulse of a positive program voltage Vpgm to the word line of a memory cell transistor, the verify read operation P43 may be the application of a pulse of a positive verify read voltage Vvfy to the word line of the memory cell transistor, and the soft erase operation P62 may be the application of a pulse of a positive program voltage Vse to the substrate of the memory cell transistor.

In example embodiments, the program operation P61 may be the application of a pulse of a negative program voltage Vpgm to the word line and the soft erase operation P62 may be the application of a pulse of a negative program voltage Vse to the substrate of a memory cell transistor.

In example embodiments, the program operation P61 may be the application of a pulse of a negative program voltage Vpgm to the substrate and the soft erase operation P62 may be the application of a pulse of a positive program voltage Vse to the substrate of a memory cell transistor.

In example embodiments, the program operation P61 may be the application of a pulse of a positive program voltage Vpgm to the word line and the soft erase operation P62 may be the application of a pulse of a negative program voltage Vse to the word line of a memory cell transistor.

In example embodiments, the control logic and high voltage generator of FIG. 3 may supply the pulse Vse to a memory cell transistor of the NAND flash array.

Figure 10:
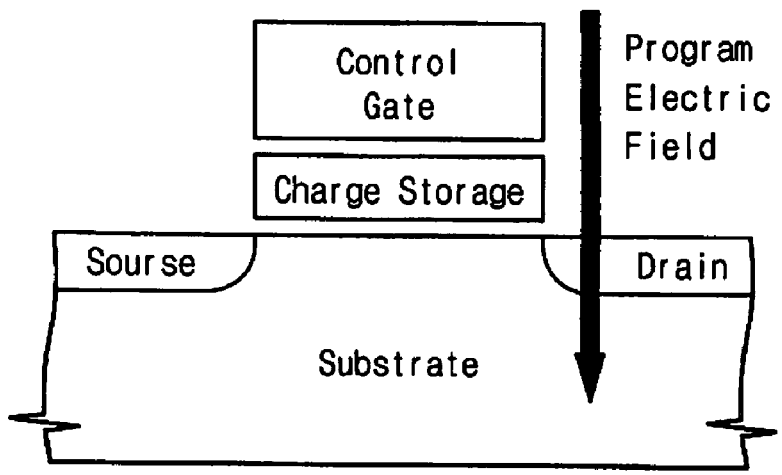
FIG. 10 illustrates an example of the direction of an electric field during a operation in accordance with example embodiments.

FIG. 10 illustrates an example of the direction of an electric field during the program operation P61 of FIGS. 9A-9B. As illustrated in FIG. 10, the electric field may be from a control gate to a substrate, when a positive program voltage Vpgm is applied to the control gate.

Figure 11:
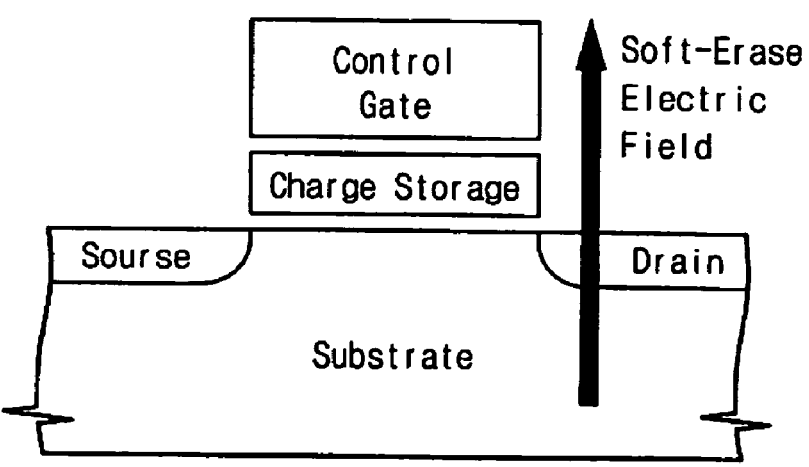
FIG. 11 illustrates a direction of an electric field for a soft erase operation in accordance with example embodiments.

FIG. 11 illustrates a direction of an electric field for the soft erase operation P62 of FIGS. 9A-9B. As illustrated in FIG. 11, the electric field may be from the substrate to the control gate when a positive soft erase voltage is applied to the substrate.

Figure 12:
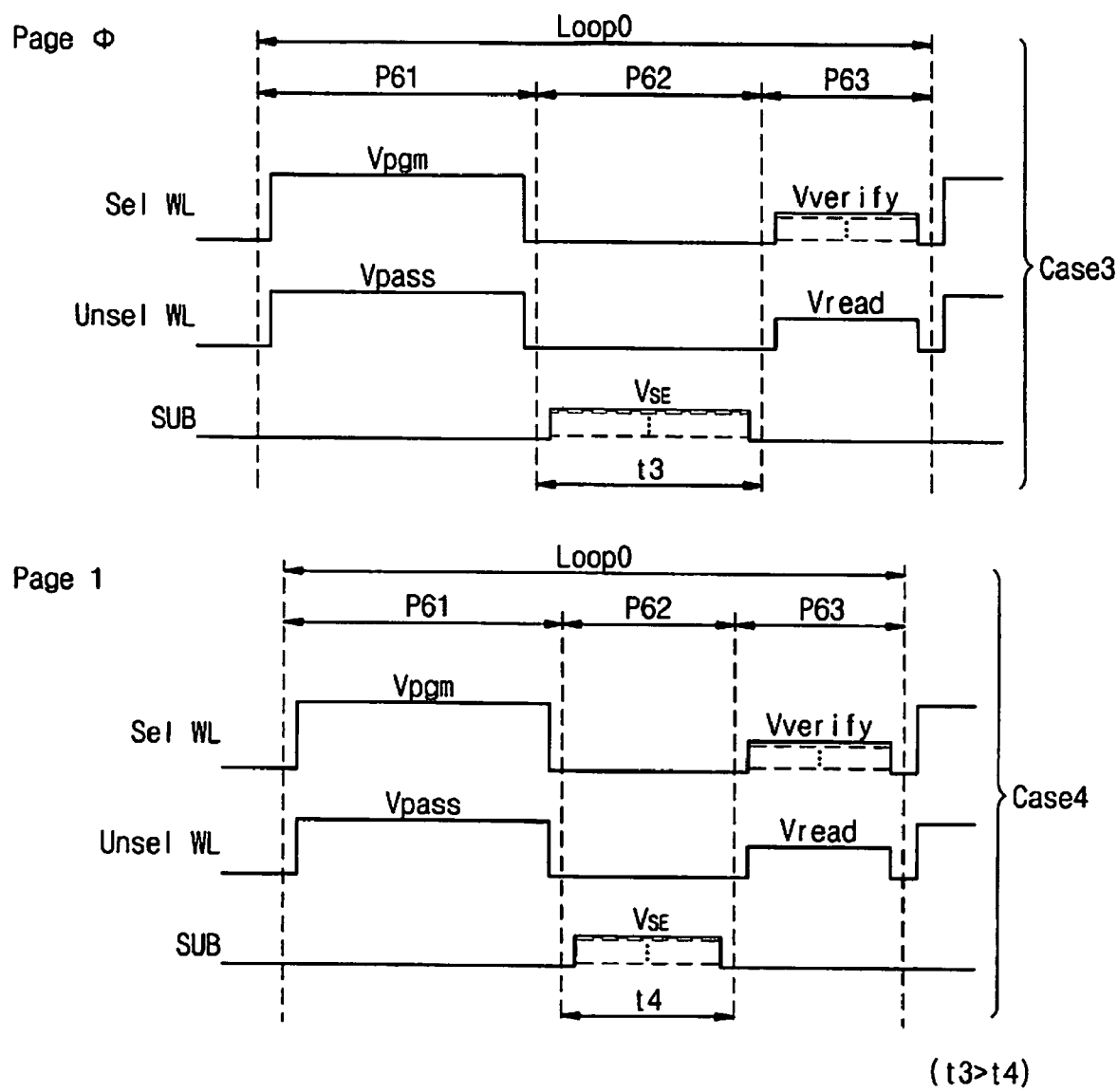
FIG. 12 illustrates example embodiments of a unit program loop in more detail.

FIG. 12 illustrates example embodiments of a unit program loop $Loop_i$ in more detail. As illustrated in FIG. 12, $Loop_0$ may include a program operation P61, a soft erase operation P62 and/or a verify read operation P63. As illustrated in FIG. 12, a program voltage Vpgm and a verify voltage Vverify may be applied to the selected word line, whereas a program Vpass and a verify read voltage Vread may be applied to all unselected word lines. In example embodiments illustrated in FIG. 12, a voltage Vse may be applied as the soft erase voltage to the substrate.

As shown in FIG. 12, an amplitude of the voltages Vpgm, Vverify, Vpass, Vread, and Vse may vary within a unit program loop $Loop_i$. Also, the amplitude of the voltages Vpgm, Vverify, Vpass, Vread, and Vse may vary from one unit program loop $Loop_i$ to another unit program loop $Loop_{i+1}$ and/or from one unit program loop $Loop_0$ of page 0 to another unit program loop $Loop_0$ of page 1.

Also, a duration of the voltages Vpgm, Vverify, Vpass, Vread, and Vse may vary with a unit program loop $Loop_i$. Also, as shown in FIG. 12, the duration of the voltages Vpgm, Vverify, Vpass, Vread, and Vse may vary from one unit program loop $Loop_i$ to another unit program loop $Loop_{i+1}$ and/or from one unit program loop $Loop_0$ of page 0 to another unit program loop $Loop_0$ of page 1. For example, a duration of Vse in Loop0 of page 0 is shown as t3, whereas a duration of Vse in Loop0 of page 1 is shown as t4, where t3>t4.

In example embodiments, page 0 and page 1 (and subsequent pages) may be single levels applied to different word lines. In other example embodiments, page 0 and page 1 (and subsequent pages) may be multi-levels of the same word line.

Any of the variations and/or alternatives discussed above in conjunction with FIGS. 5A-11 may also be applied to example embodiments illustrated in FIG. 12.

Figure 13A:
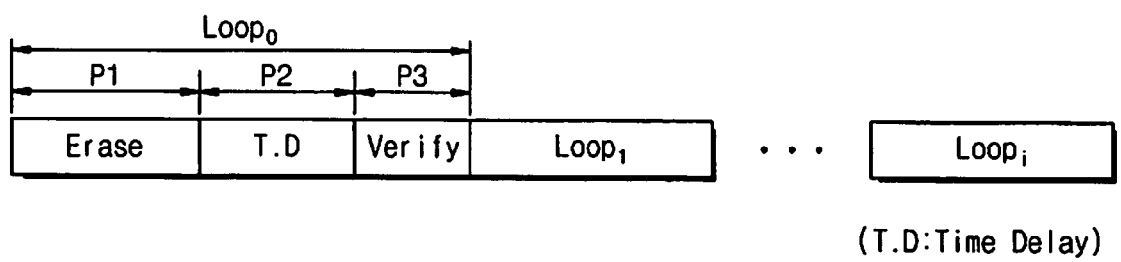
Figure 13B:
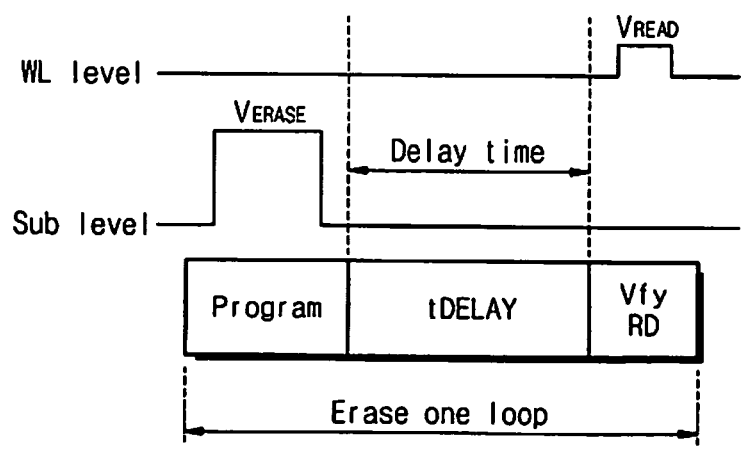

FIGS. 13A-13B illustrate an erase loop in accordance with example embodiments. As illustrated in FIGS. 13A-13B, an erase loop may include one or more erase unit loops $Loop_i$ (where i is an integer ≧1). As illustrated in FIGS. 13A-13B, each unit erase $Loop_i$ may include an erase operation P1, a time delay operation P2, and/or a verify read operation P3. In example embodiments, the time delay operation P42 is between the erase operation P1 and the verify read operation P3. In example embodiments, the time delay operation P2 allows a time margin for charges in a charge trap layer to redistribute and/or recombine. In example embodiments, the threshold voltage Vth of program cells may be changed during the time delay operation P2.

As illustrated in FIG. 13B, the erase operation P1 may be the application of a pulse of a positive voltage Verase to the substrate and the verify read operation P3 may be the application of a pulse of a positive verify read voltage Vvfy to the word line of a memory cell transistor.

In other example embodiments, the erase operation P1 may be the application of a pulse of a negative program voltage Vpgm to the substrate and the verify read operation P43 may be the application of a pulse of a negative verify read voltage Vvfy to the word line of a memory cell transistor.

Figure 14:
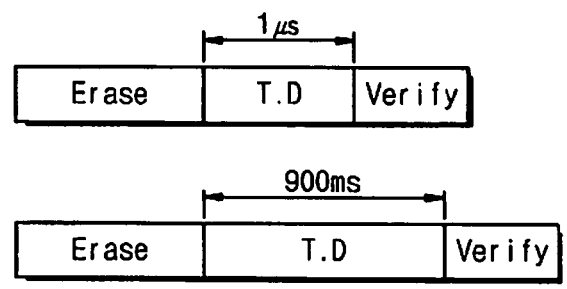

As illustrated in FIG. 14, a duration of the time delay operation P2 may be on the order of 1 μsecond to 900 milliseconds, or any duration in between.

Figure 15:
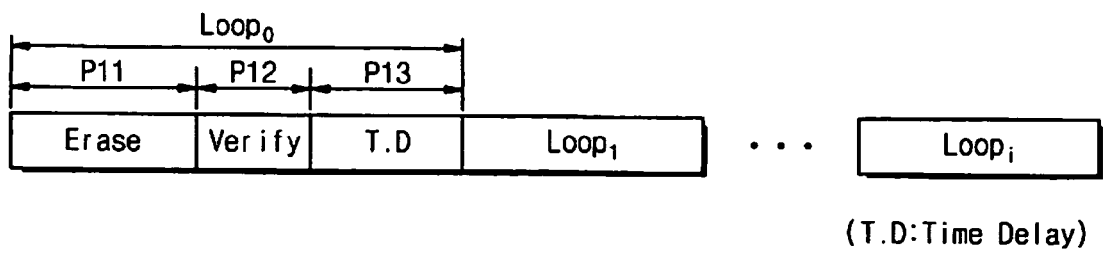

FIG. 15 illustrates an erase loop in accordance with example embodiments. As illustrated in FIG. 15, an erase loop may include one or more unit erase loops $Loop_i$ (where i is an integer ≧1). In example embodiments illustrated in FIG. 15, each unit erase loop $Loop_i$ may include an erase operation P11, a time delay operation P12, and/or a verify read operation P13. In example embodiments, the time delay P12 may be after the erase operation P11 and after the verify read operation P13. In example embodiments, the time delay operation P12 allows a time margin for charges in a charge trap layer to redistribute and/or recombine. In example embodiments, the threshold voltage Vth of program cells may be changed during the time delay operation P52.

Similar to FIG. 13B, the erase operation P1 may be the application of a pulse of a positive voltage Verase to the substrate and the verify read operation P3 may be the application of a pulse of a positive verify read voltage Vvfy to the word line of a memory cell transistor.

Figure 16:
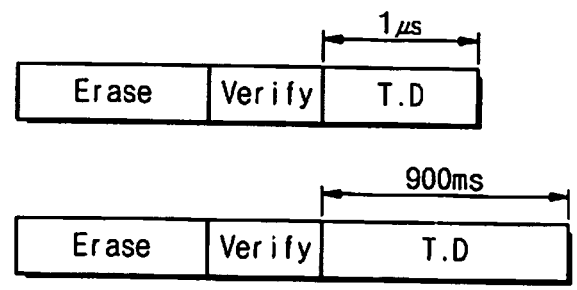

As illustrated in FIG. 16, a duration of the time delay operation P52 may be on the order of 1 μsecond to 900 milliseconds, or any duration in between.

Figure 17A:
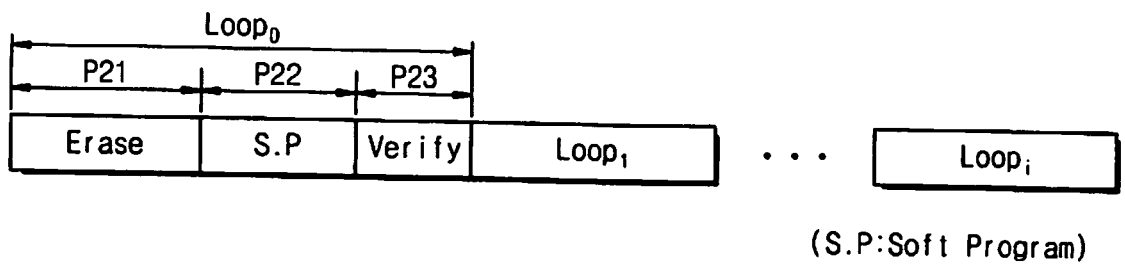
FIGS. 17A-17B illustrate an erase loop in accordance with example embodiments.
Figure 17B:
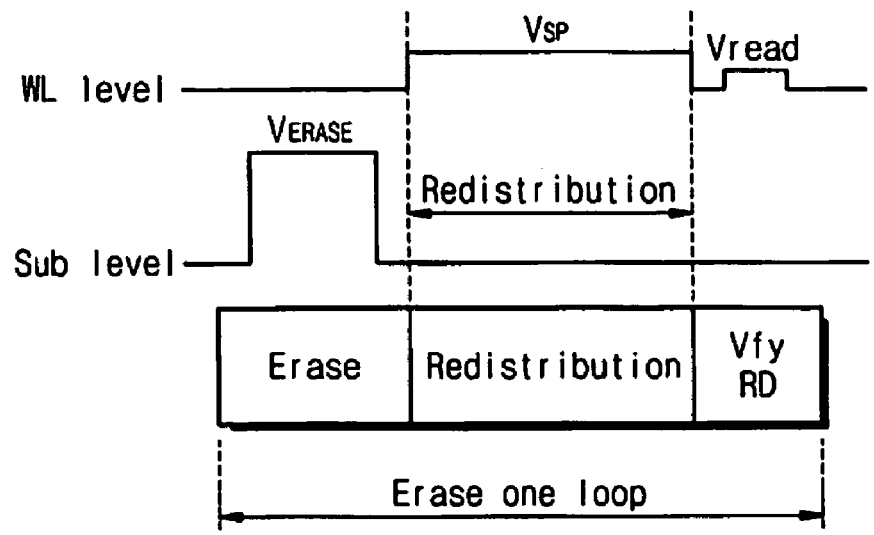

FIGS. 17A-17B illustrate an erase loop in accordance with example embodiments. As illustrated in FIGS. 17A-17B, an erase loop may include one or more unit erase loops $Loop_i$ (where i is an integer ≧1). In example embodiments illustrated in FIGS. 17A-17B, each unit erase loop Loops may include an erase operation P21, a soft program operation P22, and/or a verify read operation P23. In example embodiments, the soft program operation P22 may be between the erase operation P21 and the verify read operation P23. In example embodiments, the soft program operation P22 accelerates charges in a charge trap layer to redistribute and/or recombine. In example embodiments, a voltage (or electric field) provided in the soft program operation P22 may be smaller than a voltage (or electric field) provided in the erase operation P11.

As illustrated in FIG. 17B, the erase operation P21 may be the application of a pulse of a positive program voltage Verase to the substrate, the verify read operation P23 may be the application of a pulse of a positive verify read voltage Vvfy to the word line of the memory cell transistor, and the soft program operation P23 may be the application of a pulse of a positive program voltage Vsp to the word line of the memory cell transistor.

In example embodiments, the erase operation P21 may be the application of a pulse of a positive erase voltage Verase to the substrate and the soft program operation P22 may be the application of a pulse of a negative soft program voltage Vsp to the substrate of the memory cell transistor.

In example embodiments, the erase operation P21 may be the application of a pulse of a negative erase voltage Verase to the substrate and the soft program operation P22 may be the application of a pulse of a negative soft program voltage Vsp to the word line of the memory cell transistor.

In example embodiments, the erase operation P21 may be the application of a pulse of a negative erase voltage Verase to the word line and the soft program operation P22 may be the application of a pulse of a positive soft program voltage Vsp to the word line of the memory cell transistor.

In example embodiments, the control logic and high voltage generator of FIG. 3 may supply the pulse Vsp to a memory cell transistor of the NAND flash array.

Figure 18:
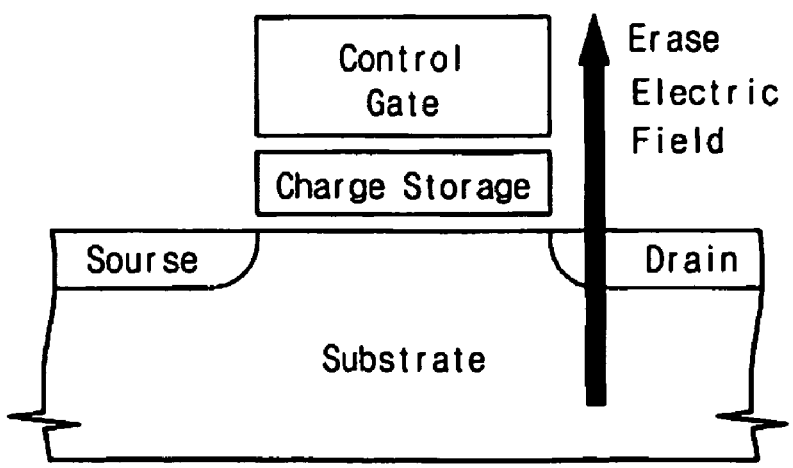

FIG. 18 illustrates an example of the direction of an electric field during the erase operation P21 of FIG. 17. As illustrated in FIG. 18, the electric field may be from the substrate to the control gate, when a positive erase voltage Verase is applied to the substrate.

Figure 19:
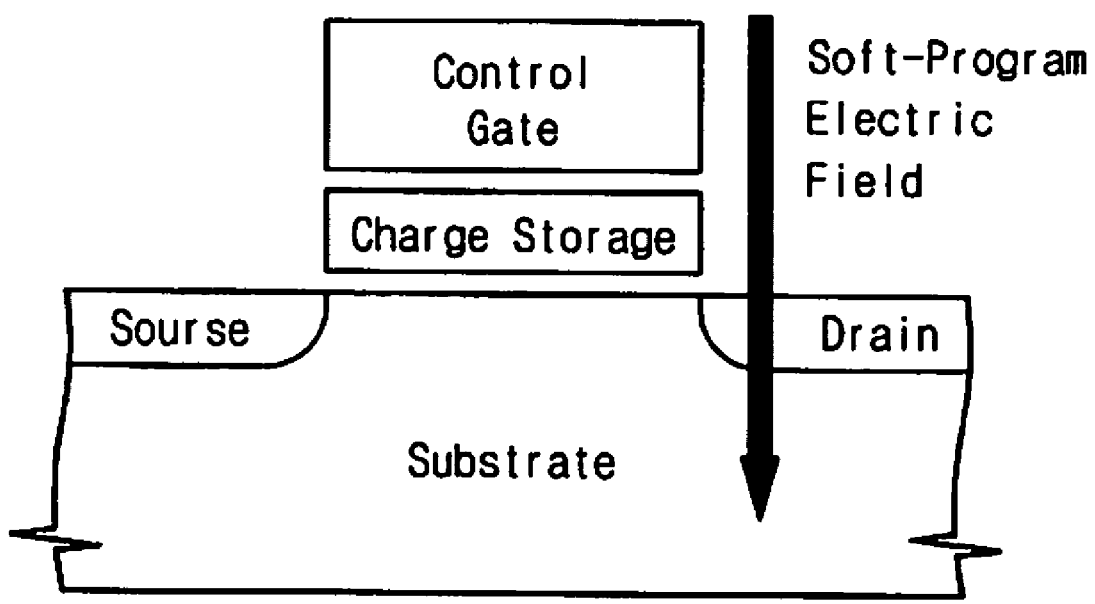

FIG. 19 illustrates a direction of an electric field for the soft program operation P22 of FIG. 17. As illustrated in FIG. 19, the electric field may be from the control gate to the substrate when a positive soft program voltage Vsp is applied to the control gate.

Figure 20:
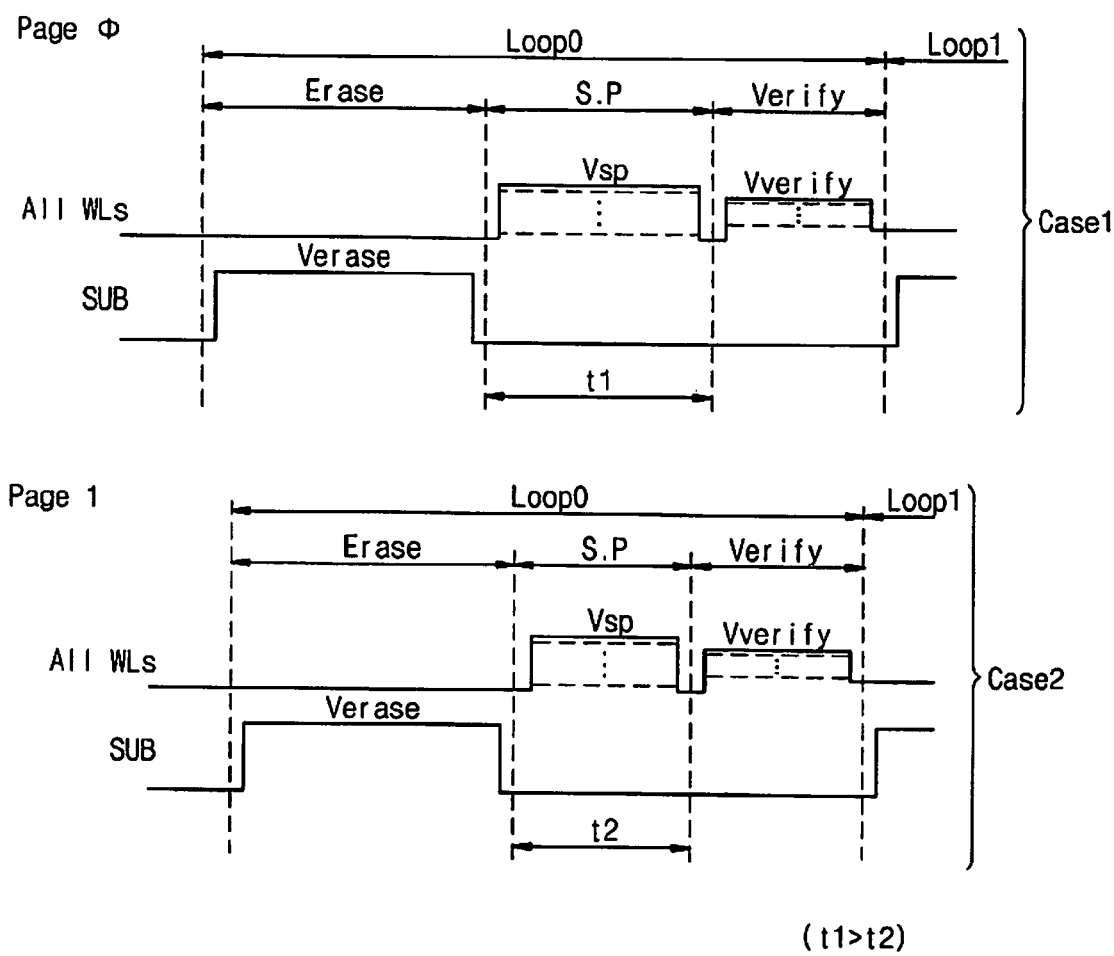

FIG. 20 illustrates example embodiments of a unit erase loop $Loop_i$ in more detail. As illustrated in FIG. 20, $Loop_0$ may include an erase operation, a soft program operation and/or a verify read operation. As illustrated in FIG. 9, an erase voltage Verase may be applied to the substrate, whereas a soft program Vsp and a verify voltage Vverify may be applied to all word lines.

As shown in FIG. 20, an amplitude of the voltages Verase, Vverify, and Vsp, may vary within a unit program loop $Loop_i$. Also, the amplitude of the voltages Verase, Vverify, and Vsp may vary from one unit program loop $Loop_i$ to another unit program loop $Loop_{i+1}$ and/or from one unit erase loop $Loop_0$ of page 0 to another unit erase loop $Loop_0$ of page 1.

Also, a duration of the voltages Verase, Vverify, and Vsp may vary within a unit erase loop $Loop_i$. Also, as shown in FIG. 20, the duration of the voltages Verase, Vverify, and Vsp may vary from one unit erase loop $Loop_i$ to another unit program loop $Loop_{i+1}$ and/or from one unit erase loop $Loop_0$ of page 0 to another unit erase loop $Loop_0$ of page 1. For example, a duration of Vsp in Loop0 in page 0 is shown as t1, whereas a duration of Vsp in Loop0 of page 1 is shown as t2, where t1>t2.

In example embodiments, page 0 and page 1 (and subsequent pages) may be single levels applied to different word lines. In other example embodiments, page 0 and page 1 (and subsequent pages) may be multi-levels of the same word line.

Any of the variations and/or alternatives discussed above in conjunction with FIGS. 13A-19 may also be applied to example embodiments illustrated in FIG. 20.

Figure 21:
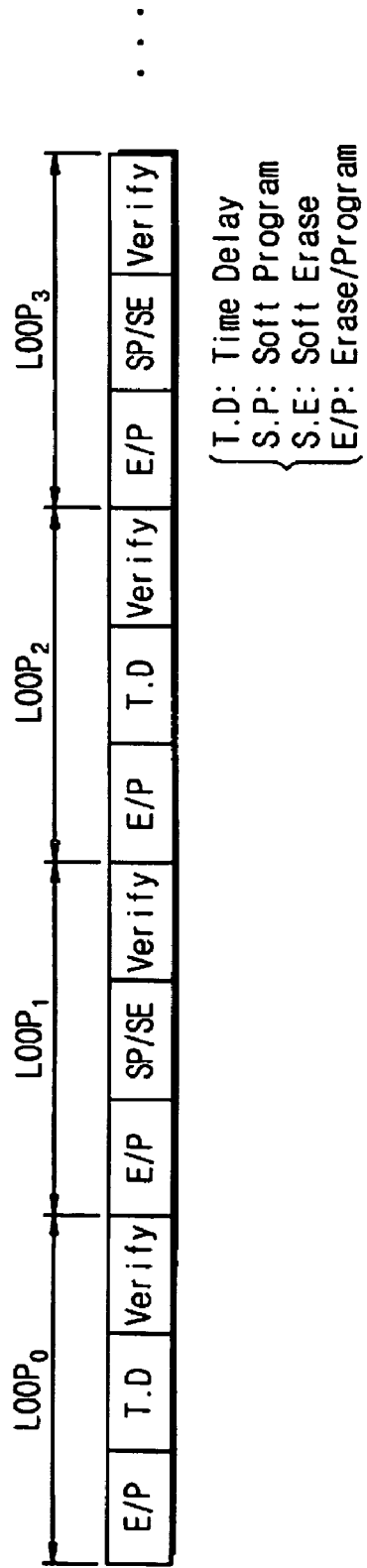

FIG. 21 illustrates a program or erase loop $Loop_0$ to $Loop_i$ in accordance with example embodiments. As shown, one unit program loop $Loop_0$ may include time delay operation TD and another unit program loop $Loop_1$ may include a soft erase operation SE. Similarly, one unit erase loop $Loop_0$ may include time delay operation TD and another unit erase loop $Loop_1$ may include soft program operation SP. In both the program or erase loops, the time delay operation TD and the soft erase operation SE/soft program operation SP may be alternately applied. In example embodiments, the first operation may be either the time delay operation TD or the soft erase operation SE/soft program operation SP.

Figure 22:
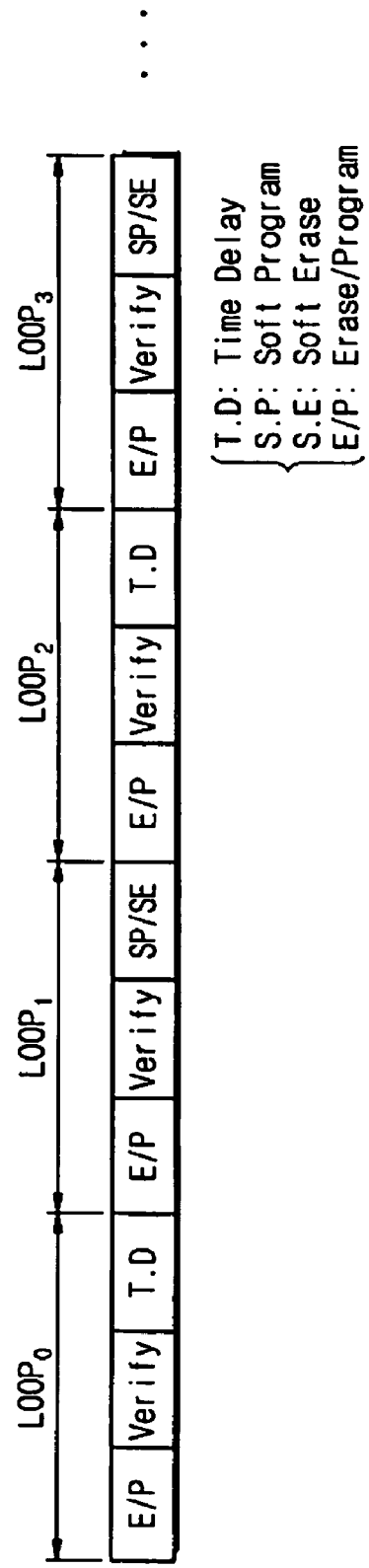

FIG. 22 illustrates a program or erase loop $Loop_0$ to $Loop_i$ in accordance with example embodiments. In FIG. 22, the time delay operation or soft program/erase operation is after the verify read operation. As shown, one unit program loop $Loop_0$ may include time delay operation TD and another unit program loop $Loop_1$ may include a soft erase operation SE. Similarly, one unit erase loop $Loop_0$ may include time delay operation TD and another unit erase loop $Loop_1$ may include soft program operation SP. In both the program or erase loops, the time delay operation TD and the soft erase operation SE/soft program operation SP may be alternately applied. In example embodiments, the first operation may be either the time delay operation TD or the soft erase operation SE/soft program operation SP.

Figure 23:
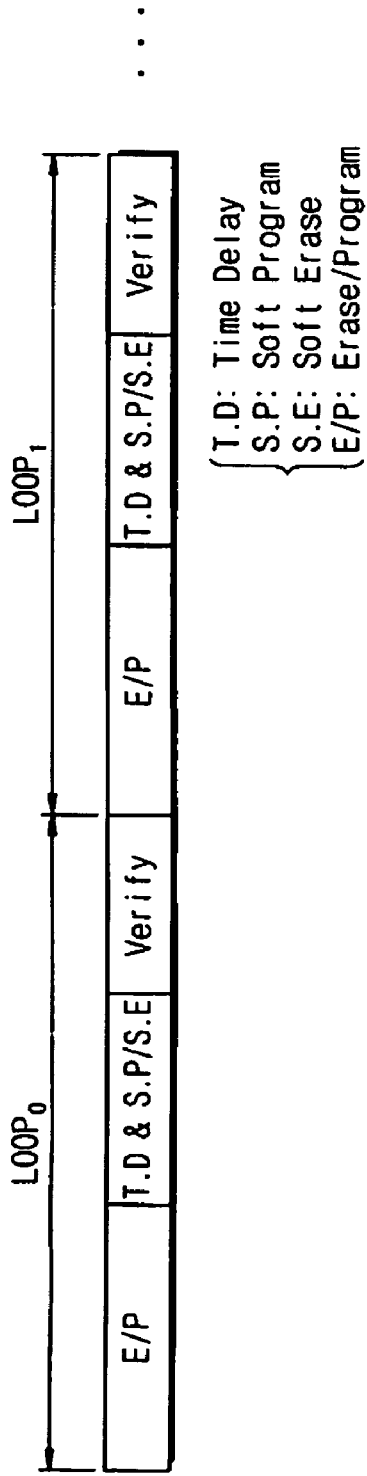

FIG. 23 illustrates a program or erase loop $Loop_0$ to $Loop_i$ in accordance with example embodiments. In FIG. 23, one unit program loop may include a time delay operation and a soft erase operation. Similarly, one unit erase loop may include both a time delay operation and a soft program operation.

As shown, one unit program loop $Loop_0$ may include time delay operation TD and a soft erase operation SE. Similarly, one unit erase loop $Loop_0$ may include a time delay operation TD and a soft program operation SP.

Figure 24:
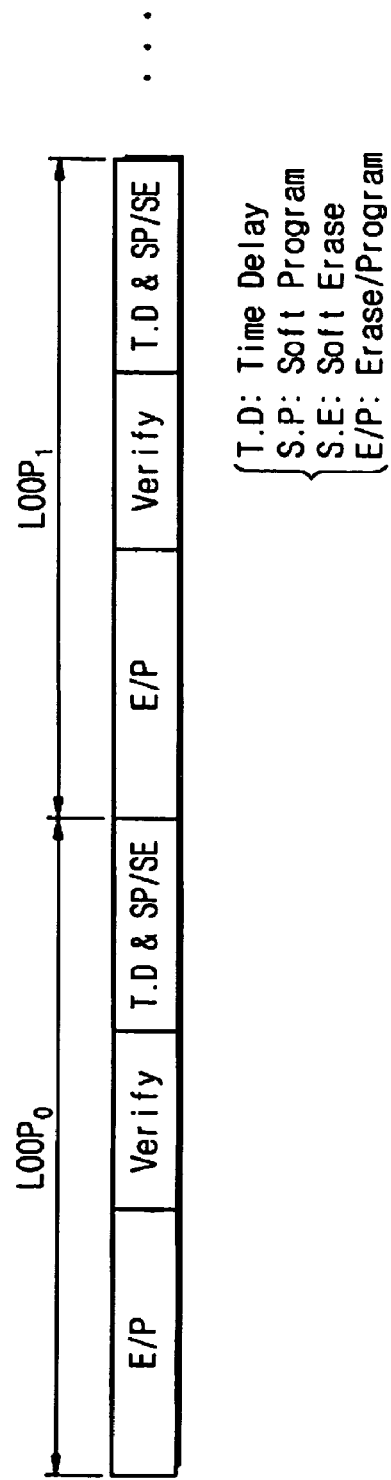
FIG. 24 illustrates a program or erase loop in accordance with example embodiments.

FIG. 24 illustrates a program or erase loop $Loop_0$ to $Loop_i$ in accordance with example embodiments. In FIG. 24, one unit program loop may include a time delay operation and a soft erase operation. Similarly, one unit erase loop may include both a time delay operation and a soft program operation. In FIG. 24, the time delay operation or soft program/erase operation is after the verify read operation.

In example embodiments, applying a time delay may mean waiting, for example, intentionally waiting for a given a delay time on the word line before another voltage is applied. In example embodiments, applying a time delay may mean no pulse or voltage is intentionally applied pulse that causes the nonvolatile memory to change state and/or operation.

In example embodiments, the charge storage layer may any charge storage layer, for example, a floating gate or a charge trap layer.

Any of the variations and/or alternatives discussed above in conjunction with FIGS. 5A-20 may also be applied to example embodiments illustrated in FIGS. 21-24.

Figure 25:
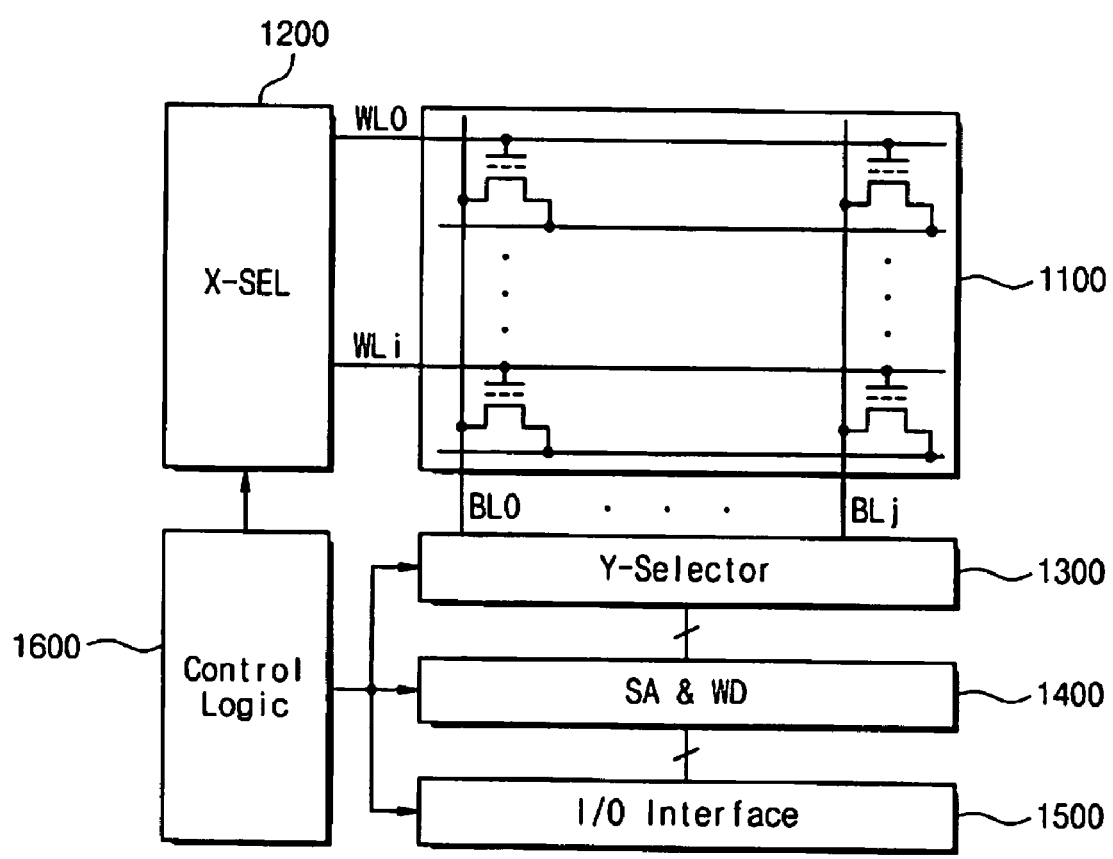
FIG. 25 illustrates a NOR flash memory in accordance with example embodiments.

FIG. 25 illustrates a NOR flash memory in accordance with example embodiments. As illustrated in FIG. 25, the NOR flash memory may include a memory array 1100, an X-selector 1200, a Y-selector 1300, an SA & WD 1400, an I/O interface 1500, as such or control logic 1600.

Figure 26:
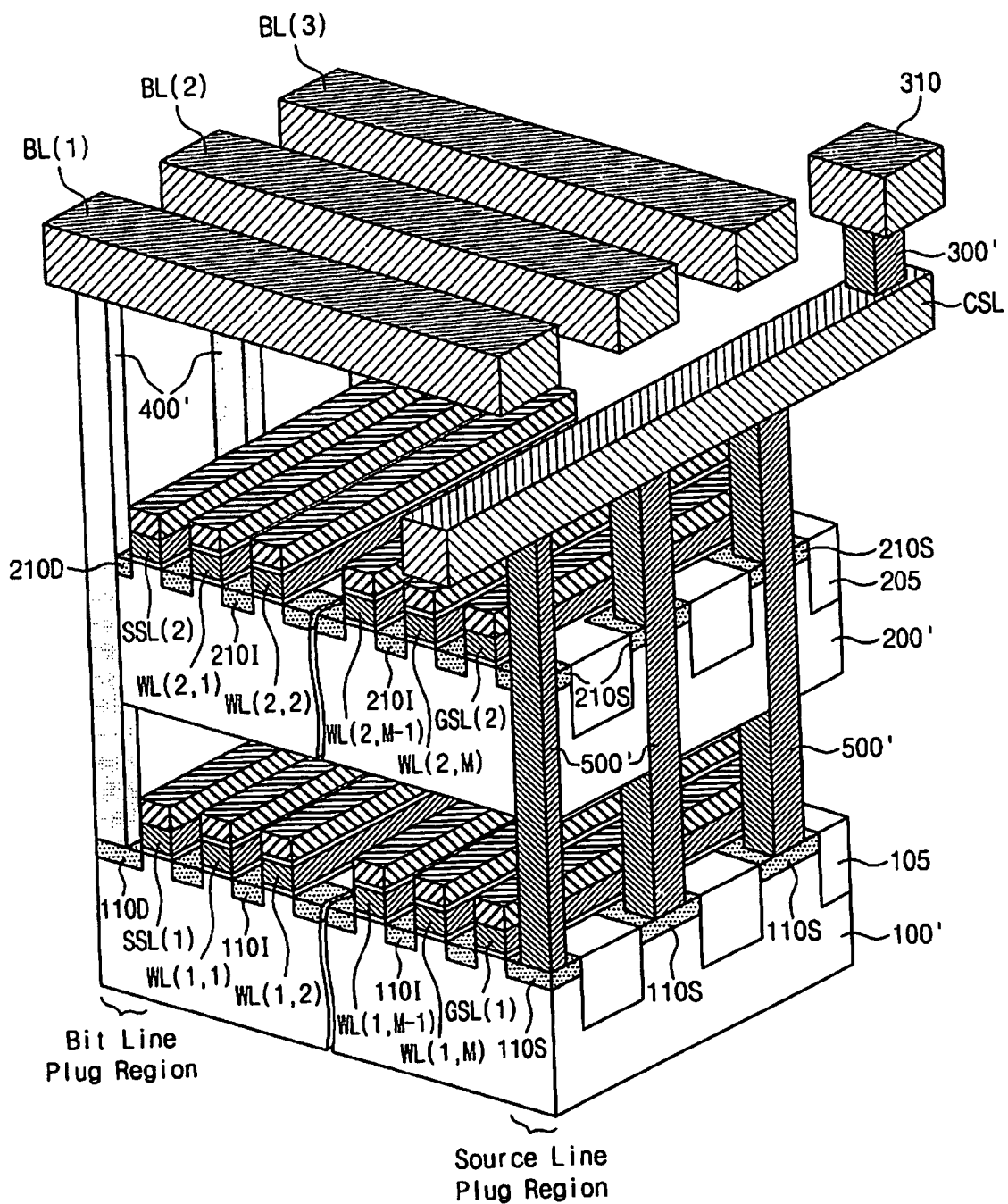
FIG. 26 illustrates a stack flash memory in accordance with example embodiments.

FIG. 26 illustrates a stack flash memory in accordance with example embodiments. A flash memory device according to example embodiments may include 3-dimensionally arranged memory cells. The memory cells may include a plurality of stacked semiconductor layers used as a semiconductor substrate for the MOS transistor formation. For the purpose of convenience of description, only two semiconductor layers (e.g., a first semiconductor layer 100' and a second semiconductor layer 200') are illustrated in FIG. 26, but there may be more than two semiconductor layers.

According to example embodiments, the first semiconductor layer 100' may be a single-crystalline silicon wafer, and the second semiconductor layer 200' may be a single crystalline silicon epitaxial layer formed through an epitaxial process using the first semiconductor layer 100' (e.g., wafer) as a seed layer. Any conventional method of forming an epitaxial semiconductor layer on a semiconductor wafer using an epitaxial process may be used for example embodiments.

According to example embodiments, the semiconductor layers 100' and 200' may have cell arrays with substantially the same structure. Consequently, the memory cells may constitute multi-layered cell arrays. To avoid complexity of description due to the multi-layered disposition, the notation for describing each of elements of the cell array such as a gate structure, a common source line (CSL), bit-line plugs, and impurity regions will be defined first. In order to describe vertical locations of the respective elements, the order of semiconductor layers 100' and 200' where the elements are disposed will be attached in parentheses after the element name. For example, a GSL(1) and an SSL(2) represent a ground selection line formed on the first semiconductor layer 100', and a string selection line formed on the second semiconductor layer 200', respectively.

Each of the semiconductor layers 100' and 200' may include active regions defined by well-known device isolation layer patterns 105, 205. The active regions may be formed parallel to each other in one direction. The device isolation layer patterns 105, 205 may be formed of insulating materials including silicon oxide, and electrically isolate the active regions.

A gate structure including a pair of selection lines GSL and SSL and M word lines WLs may be disposed on each of the semiconductor layers 100' and 200'. Source plugs 500' may be disposed at one side of the gate structure, and bit-line plugs 400 may be disposed at the other side of the gate structure. The bit-line plugs 400' may be respectively connected to N bit lines BLs crossing the word lines WLs. In example embodiments, the bit lines BLs are formed across the word lines WLs on the uppermost semiconductor layer (e.g., the second semiconductor layer 200' in FIG. 26). The number N of the bit lines BLs may be a constant greater than 1, and may be in multiples of eight.

The word lines WLs may be disposed between the selection lines GSL and SSL. The number M of word lines WLs constituting one gate structure may be a constant greater than 1, and may be in multiples of eight. One of the selection lines GSL and SSL may be used as a ground selection line GSL controlling electric connection between a common source line CSL and memory cells, and another one of the selection lines may be used as a string selection line SSL controlling electric connection between bit lines and the memory cells.

Impurity regions may be formed in the active regions between the selection lines and the word lines, and between the word lines. In example embodiments, of the impurity regions, impurity regions 110S and 210S formed at one set of sides of the respective ground selection lines GSL(1) and GSL(2) may be used as source electrodes connected to the common source line CSL through the source plugs 500'. Impurity regions 110D and 210D formed at sides of the string selection lines SSL(1) and SSL(2) may be used as drain electrodes connected to the bit lines BLs through the bit-line plugs 400. Also, impurity regions 110I and 210I formed at both sides of the word lines WLs may be used as internal impurity regions connecting the memory cells in series.

According to example embodiments, the source plugs 500' may be formed at the first and second semiconductor layers 100' and 200', and electrically connect the impurity regions 110S and 210S (hereinafter, referred to as first and second source regions), which may be used as the source electrodes, to the first and second semiconductor layers 100' and 200'. Consequently, the first and second regions 110S and 210S form an equipotential with the semiconductor layers 100' and 200'.

According to example embodiments, as illustrated in FIG. 26, the source plugs 500' pass through the second semiconductor layer 200' and the second source regions 210S, and are connected to the first source regions 110S for electric connection. In example embodiments, each of the source plugs 500' directly contacts inner walls of the second semiconductor layer 200 and the second source region 210S.

Example embodiments of erase and program methods (or, write methods) described above may be applied to the stack flash structure in FIG. 26.

Figure 27:
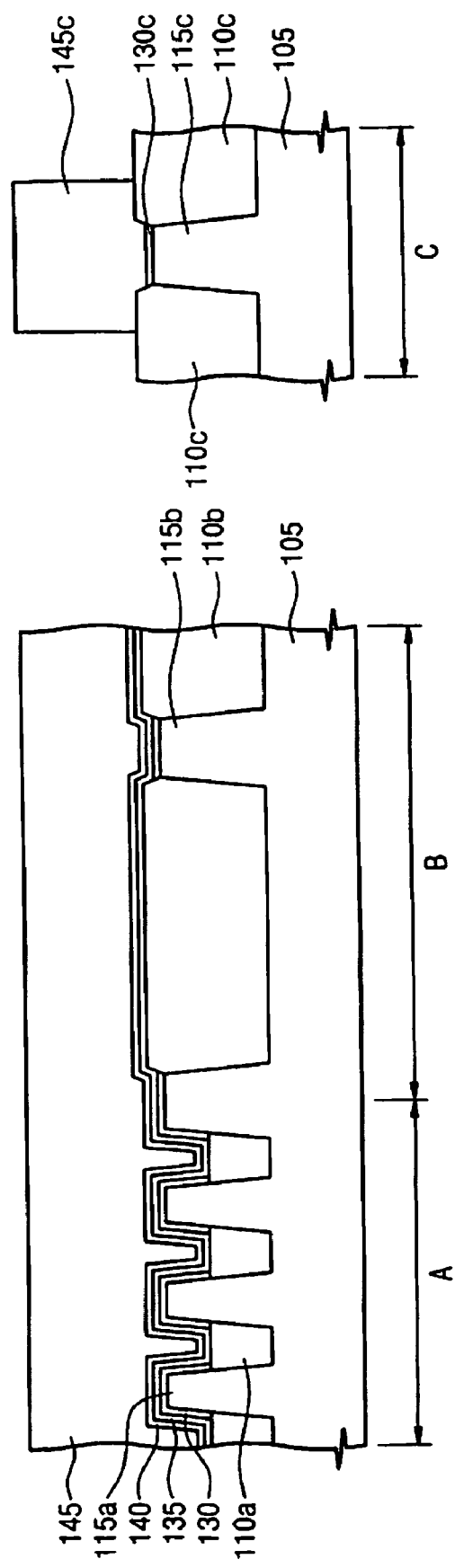
FIG. 27 illustrates a fin-flash memory in accordance with example embodiments.

FIG. 27 illustrates a fin-flash memory in accordance with example embodiments. As shown, in a fin-type structure, a semiconductor substrate may be defined to have a plurality of regions. For example, the semiconductor substrate may be divided into a cell region A, a peripheral region C, and a boundary region B, between the cell region A and the peripheral region C. The cell region A may be a portion where memory transistors are formed, and the peripheral region C may be a portion where peripheral circuit devices are formed to control an operation of memory transistors. The boundary region B may be used to distinguish regions A and C. For example, it may be defined as a portion including edges of the cell and peripheral regions A and C.

A first device isolation film 110a may be provided at a first region of the semiconductor substrate, for example, the cell region A, and second device isolation films 110b and 110c may be provided at a second region, for example, the boundary region B and/or the peripheral region C. The first device isolation film 110a may be formed to be recessed by a given depth from a surface of the semiconductor substrate, so that a fin-type of a first active region 115a is defined. The second device isolation films 110b and 110c may be provided to be on a surface of the semiconductor substrate or may protrude from the surface thereof, so that a plane-type of second active regions 115b and 115c are defined. The first device isolation film 110a and the second device isolation films 110b and 110c are illustrated to have the same bottom depth, but they also may have different bottom depths.

The first active region 115a may have a solid shape because its upper and side surfaces are exposed from the first device isolation film 110a. On the other hand, the second active regions 115b and 115c may have a one-dimensional shape because their upper surfaces are exposed from the second device isolation films 110b and 110c. A recessed depth of the first device isolation film 110a may be a factor that is used to determine a depth of an exposed side surface of the first active region 115a and may be controlled according to a required characteristic of a device.

A tunnel oxide film 130, a storage node film 135, a blocking oxide film 140, and/or a control electrode 145 may be formed at the cell region A to form a memory transistor or may provided in regions A and B. The storage node film 135 may be provided on the tunnel oxide film 130 and extend onto the device isolation films 115a and 115b. The blocking oxide film 140 may be provided on the storage node film 135 and across the active regions 115a and 115b on the blocking oxide film 140.

Memory transistors in the cell region A may have a fin-type structure and use the first active region 115a as a part of the respective bit lines and the control gate electrode 145 as a part of the respective word lines. This enables surfaces of upper and lateral sides of the first active region 115a to be used as a channel region. A plane-type transistor is capable of being provided at the peripheral region C. For example, a plane-type transistor may include a gate oxide film 130c on the peripheral region C and a gate electrode 145c on the gate oxide film 130c.

Example embodiments of erase and program methods (or, write methods) described above may be applied to the fin-type structure in FIG. 27.

Figure 28:
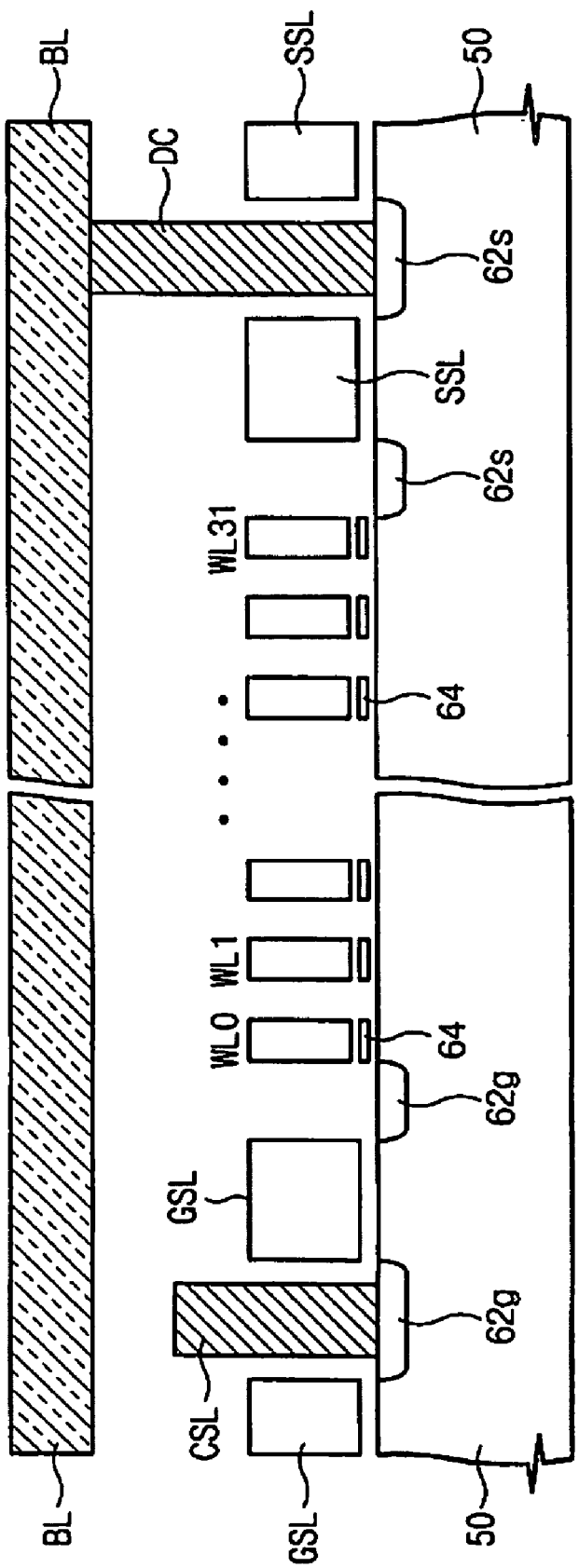
FIG. 28 illustrates a flash memory without a source and drain in accordance with example embodiments.

FIG. 28 illustrates a flash memory without a source and drain in accordance with example embodiments. As shown, FIG. 28 illustrates a source/drain-free flash structure, ground selection transistors, string selection transistors, and cell transistors formed in active fields defined in a semiconductor substrate 50. A string selection line SSL, a ground selection line GSL, and word lines WL0~WL31 may be arranged crossing over the active fields. Bit line BL may be connected to the source/drain region placed at a side of the string selection line SSL through a bit line contact DC. Each word line may include a charge storage layer 64 interposed between the gate electrode and the active field. The charge storage layer 64 may be formed of a floating gate, or a charge-storing insulation layer in a SONOS structure. Otherwise, the charge storage layer 64 may be made up of a semiconductor or a metallic nano-crystalline layer.

Source/drain regions 62g formed at both sides of the ground selection line GSL and source/drain regions 62g formed at both sides of the string selection line SSL may be kinds of PN-junction source/drain regions formed of diffusion layers with conductivity opposite to the substrate. Source/drain regions between the word lines WL0~WL31 may not be formed as typical PN junction types, but in the form of inversion layers, or field effect source/drain regions, the inversion layers being generated by fringe fields induced from voltages applied to the adjacent word lines. In example embodiments, the active fields corresponding to the channel and source/drain regions of the transistors may be formed with enhanced charge mobility, so that they may compensate for lack of an on-current by adopting the structure of field effect source/drain regions.

Figure 29:
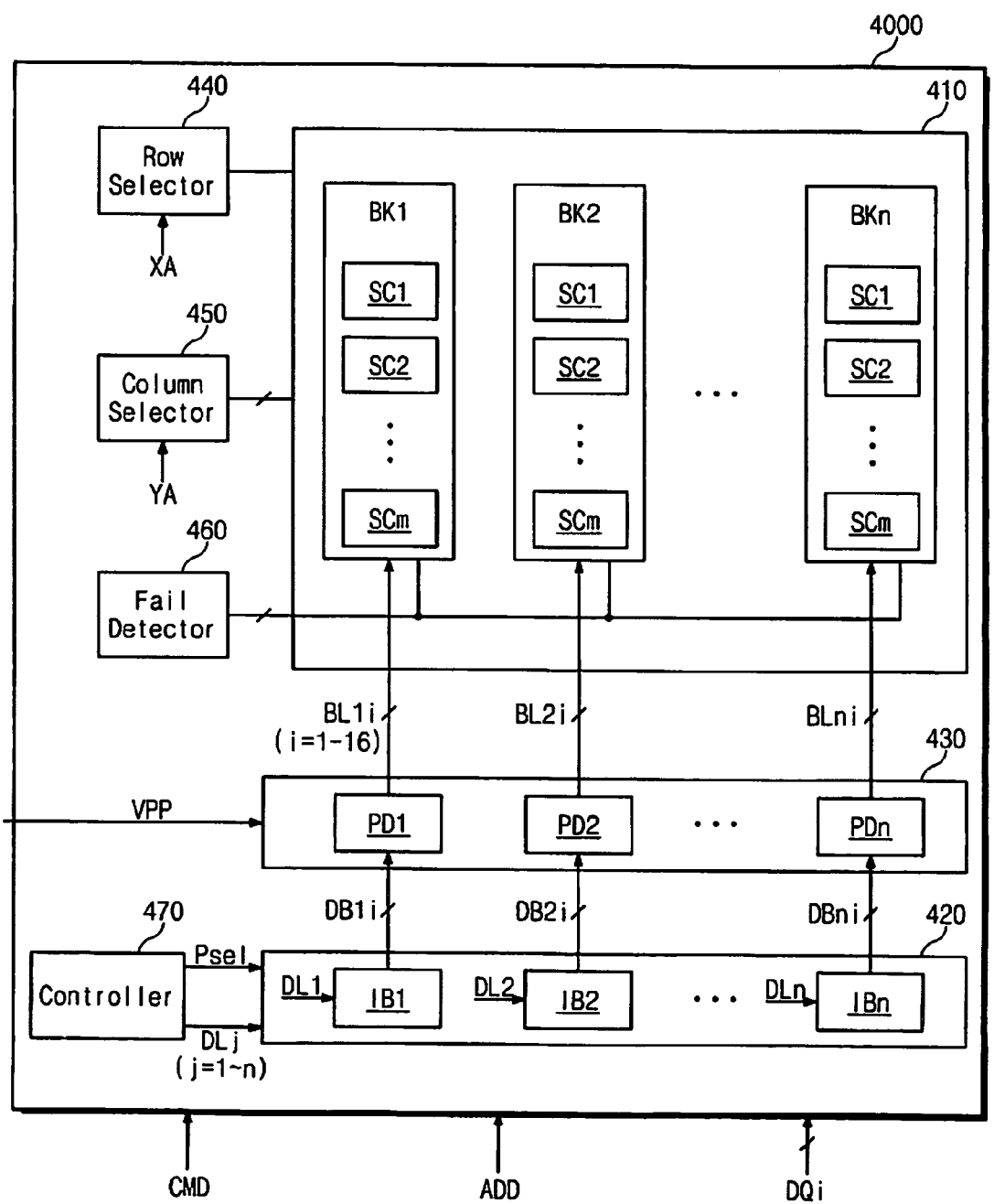
FIG. 29 illustrates a NOR flash memory according to example embodiments.

FIG. 29 illustrates a NOR flash memory according to example embodiments. As shown, the NOR flash memory device 4000 may includes a cell array 410, a row selector 440, and/or a column selector 450.

The cell array 410 may be composed of a plurality of banks BK1-BKn. Each bank may include a plurality of sectors SC1-SCm, each as a unit of erasing. Each sector may be constructed of a plurality of memory cells (not shown) coupled to a plurality of word lines and bit lines. Output lines and output circuitry are not shown in FIG. 29 so that the overall NOE flash memory device 4000 is simply and clearly illustrated.

The row selector 440 may select one word line in response to a row address XA. The column selector 450 may select 16 bit lines for every bank in response to a column address YA. The structures and operations regarding the cell array 410, the row selector 440, and the column selector 450 will be described with reference to FIG. 30 in more detail.

The NOR flash memory device 4000 may also include a data input buffer 420, a program driver 430, and/or a controller 470. The data input buffer 420 may receive program data of 16 bits in parallel, equal to the number of banks. The program data may be stored in unit buffers IB1-IBn of the input buffer 420 in units of 16 bits. The unit buffers IB1-IBn may be alternatively operable under the control of data latch signals DLj (j=1.about.n). For instance, if DL1 is a high level, the first unit buffer IB1 receives 16 data bits in parallel. The received data may be held in the first unit buffer IB1 for a time. The data input buffer 420 may dump data held in the unit buffers IB1-IBn contemporaneously to the program driver 430 when the program selection signal PSEL is a high level.

The controller 470 may apply the program selection signal PSEL and the data latch signal DLj to the data input buffer 420. The data input buffer 420 may receive the program data in units of 16 bits by the number of the banks or less, alternatively or sequentially, under regulation of the controller 470.

The program driver 30 may apply a program voltage contemporaneously to selected bit lines among bit line packets BL1i-BLni (for example, i=1 to 16) in response to program data packets DB1i-DBni (for example, i=1 to 16) stored in the data input buffer 420. The program driver may include unit drivers PD1-PDn corresponding to the unit buffers IB1-IBn. The program driver 430 may be supplied with a high voltage VPP from an external power source that is greater than the (internal) power source voltage. The high voltage VPP from the external source may be used for supplying a drain voltage and a cell current of a selected cell transistor in a program operation. Otherwise, it may be possible to supply the high voltage VPP internally by using a charge pump circuit (not shown) embedded in the NOR flash memory device.

The NOR flash memory device 4000 may also include a fail detector 460. The fail detector senses data stored in the cell array 410 and then detects a failure of programming by comparing the sense data with the program data stored in the data input buffer 420. The fail detector 460 is shared by all the banks of the cell array 410.

As illustrated in FIG. 29, the NOR flash memory device 4000 may receive command signals CMD, address signals ADD, data DQi, and the high voltage VPP. For example, these signals may be supplied from a host device or memory controller.

Figure 30:
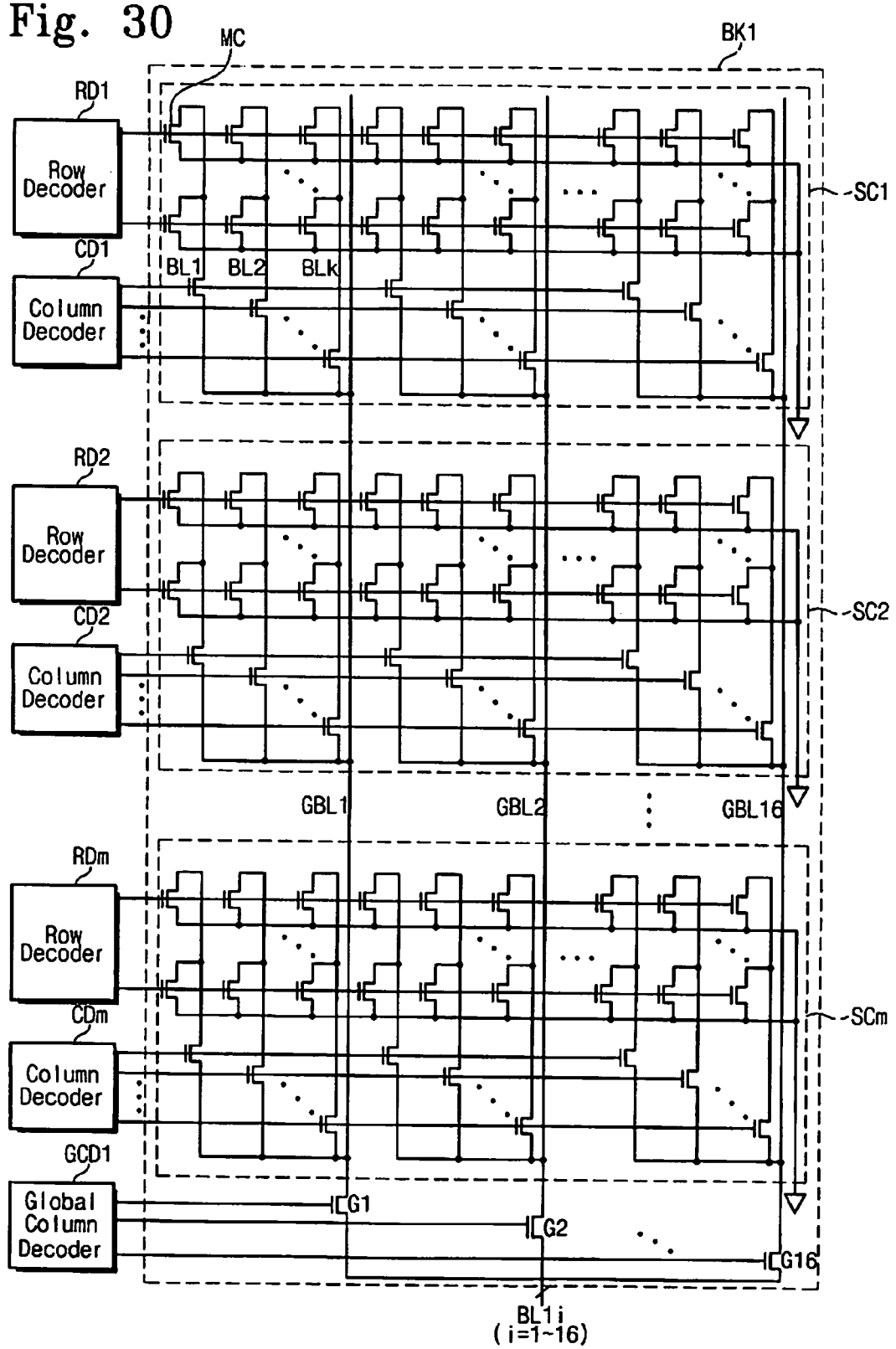
FIG. 30 illustrates an example circuit pattern of a first bank shown in FIG. 30.

FIG. 30 illustrates a circuit pattern of the first bank BK1 as an example associated with the row and column selectors and the peripherals, shown in FIG. 29. The row selector 440 may include a plurality of row decoders RD1-RDm while the column selector 450 may include a plurality of column decoders CD1-CDm. Pairs of the row and column decoders correspond each to the sectors SC1-SCm. The column selector 450 may further be comprised of a global column decoder GCD1 arranged corresponding to the first bank BK1.

Referring to FIG. 30, in the first bank BK1 composed of the plurality of sectors SC1-SCm, each of which forms the erase unit, the first sector SC1 is coupled to the row decoder RD1 for driving a word line assigned to a selected memory cell MC and the column decoder for selecting the bit lines BL1-BLk that are assigned to a global bit line (e.g., GBL1). The memory cells MC may be formed according to example embodiments. The global bit lines are exemplarily arranged in numbers of 16, so that each of the global bit lines GBL1-GBL16 is linked with the bit lines BL1-BLk (namable as local bit lines relative to the global bit lines) through their corresponding column gate transistors in every sector. The column gate transistors are controlled by the column decoder corresponding thereto. Other sectors may be disposed with the same connected feature as the first sector SC1.

The global bit lines GBL1-GBL16 may be lead from one (e.g., BL1i) of the bit line packets BL1i-BLni provided by the program driver 30, each by way of selection transistors G1-G16 controlled by the global column decoder GCD1. As a result, the memory cell array may be constructed in a hierarchical architecture with the local bit lines each connected to the memory cells along columns and the global bit lines each connected to a group of the local bit lines.

Because the operation and further detailed structure of the NOR flash memory illustrated in FIGS. 29-30 is well-known, further description will not be provided for the sake of brevity. Instead, U.S. Pat. No. 7,072,214 illustrating an example NOR flash memory, which may employ example embodiments, is hereby incorporated by reference in its entirety.

Furthermore, it will be appreciated that example embodiments are not limited in application to a NOR flash memory having the architecture described above with respect to FIGS. 29-30. Instead, example embodiments may be applied to the cell array of various NOR flash memory architectures.

Figure 31:
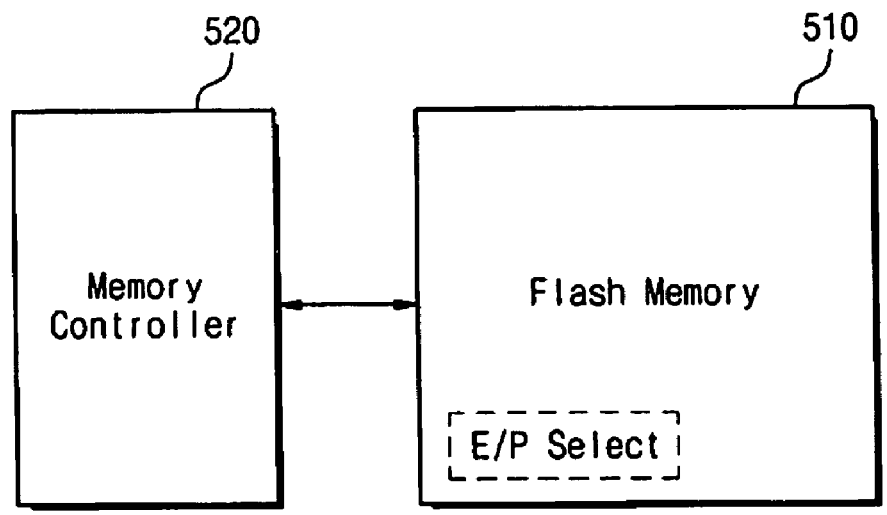
FIG. 31 illustrates another example embodiment including a memory controller in accordance with example embodiments.

FIG. 31 illustrates another example embodiment. As shown, FIG. 31 includes a memory 510 connected to a memory controller 520. The memory 510 may be the NAND flash memory or NOR flash memory discussed above. However, the memory 510 is not limited to these memory architectures, and may be any memory architecture having memory cells formed according to example embodiments.

The memory controller 520 may supply the input signals for controlling operation of the memory 510. For example, in the case of a NAND flash memory, the memory controller 520 may supply the command CMD and address signals. In the example of the NOR flash memory of FIGS. 29-30, the memory controller 520 may supply the CMD, ADD, DQ and VPP signals. It will be appreciated that the memory controller 520 may control the memory 510 based on received control signals (not shown).

Figure 32:
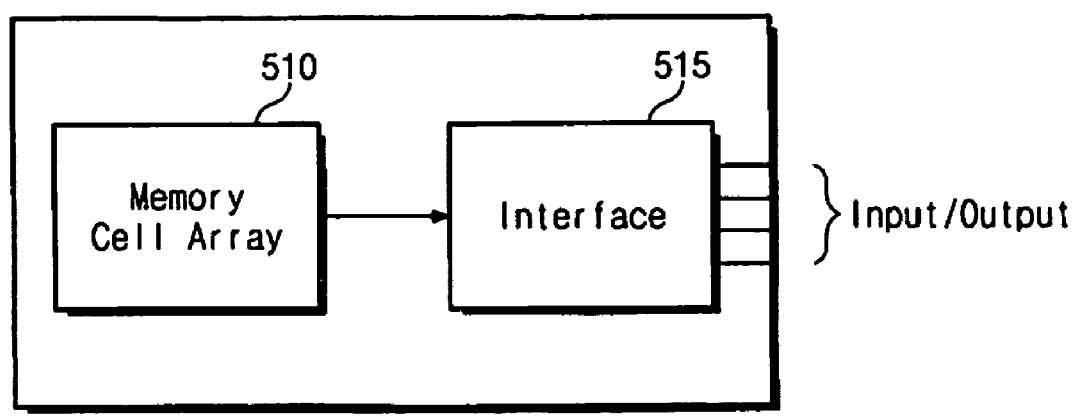
FIG. 32 illustrates another example embodiment including an interface in accordance with example embodiments.

FIG. 32 illustrates another example embodiment. As shown, FIG. 32 includes a memory 510 connected to an interface 515. The memory 510 may be the NAND flash memory or NOR flash memory discussed above. However, the memory 510 is not limited to these memory architectures, and may be any memory architecture having memory cells formed according to example embodiments.

The interface 515 may supply the input signals (for example, generated externally) for controlling operation of the memory 510. For example, in the case of a NAND flash memory, the interface 515 may supply the command CMD and address signals. In the example of the NOR flash memory of FIGS. 29-30, the interface 515 may supply the CMD, ADD, DQ and VPP signals. It will be appreciated that the interface 515 may control the memory 510 based on received control signals (for example, generated externally, but not shown).

Figure 33:
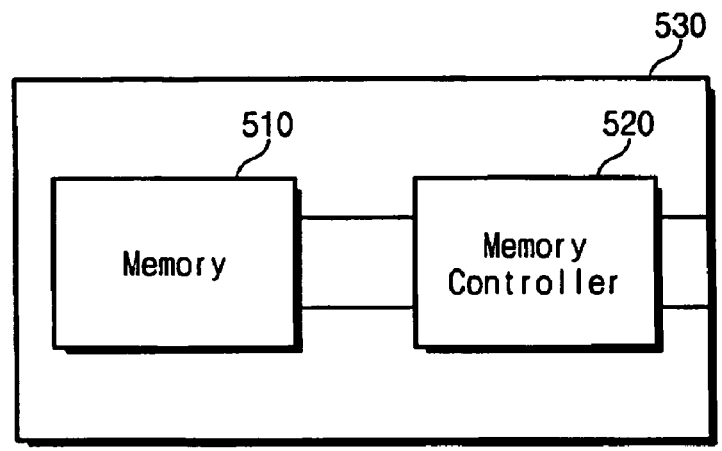
FIG. 33 illustrates an example memory card in accordance with example embodiments.

FIG. 33 illustrates another example embodiment. FIG. 33 is similar to FIG. 31, except that the memory 510 and memory controller 520 have been embodied as a card 530. For example, the card 530 may be a memory card such as a flash memory card. Namely, the card 530 may be a card meeting any industry standard for use with a consumer electronics device such as a digital camera, personal computer, etc. It will be appreciated that the memory controller 520 may control the memory 510 based on controls signals received by the card 530 from another (e.g., external) device.

Figure 34:
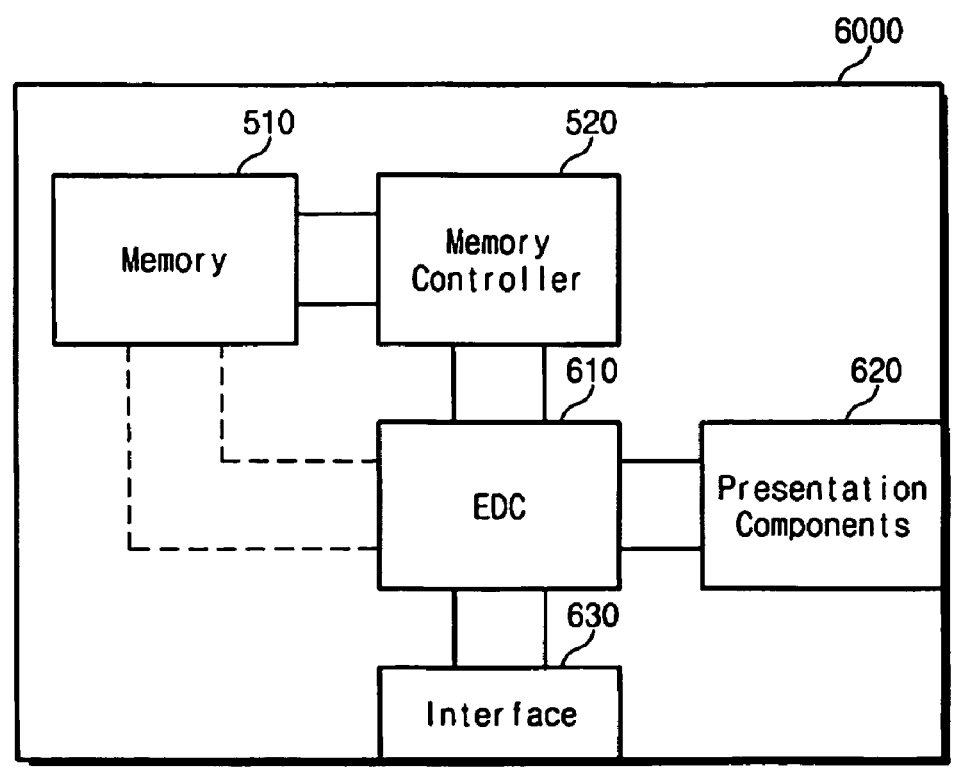
FIG. 34 illustrates an example portable device in accordance with example embodiments.

FIG. 34 illustrates another example embodiment. FIG. 34 represents a portable device 6000. The portable device 6000 may be an MP3 player, video player, combination video and audio player, etc. As shown, the portable device 6000 includes the memory 510 and memory controller 520. The portable device 6000 may also includes an encoder and decoder 610, presentation components 620 and interface 630.

Data (video, audio, etc.) may be input to and output from the memory 510 via the memory controller 520 by an encoder and decoder (EDC) 610. As shown by the dashed lines in FIG. 34, the data may be directly input to the memory 510 from the EDC 610 and/or directly output from the memory 510 to the EDC 610.

The EDC 610 may encode data for storage in the memory 510. For example, the EDC 610 may perform MP3 encoding on audio data for storage in the memory 510. Alternatively, the EDC 610 may perform MPEG encoding (e.g., MPEG2, MPEG4, etc.) on video data for storage in the memory 510. Still further, the EDC 610 may include multiple encoders for encoding different types of data according to different data formats. For example, the EDC 610 may include an MP3 encoder for audio data and an MPEG encoder for video data.

The EDC 610 may decode output from the memory 510. For example, the EDC 610 may perform MP3 decoding on audio data output from the memory 510. Alternatively, the EDC 610 may perform MPEG decoding (e.g., MPEG2, MPEG4, etc.) on video data output from the memory 510. Still further, the EDC 610 may include multiple decoders for decoding different types of data according to different data formats. For example, the EDC 610 may include an MP3 decoder for audio data and an MPEG decoder for video data.

It will also be appreciated that EDC 610 may include only decoders. For example, already encoded data may be received by the EDC 610 and passed to the memory controller 520 and/or the memory 510.

The EDC 610 may receive data for encoding, or receive already encoded data, via the interface 630. The interface 630 may conform to a known standard (e.g., firewire, USB, etc.). The interface 630 may also include more than one interface. For example, interface 630 may include a firewire interface, a USB interface, etc. Data from the memory 510 may also be output via the interface 630.

The presentation components 620 may present data output from the memory, and/or decoded by the EDC 610, to a user. For example, the presentation components 620 may include a speaker jack for outputting audio data, a display screen for outputting video data, and/or etc.

Figure 35:
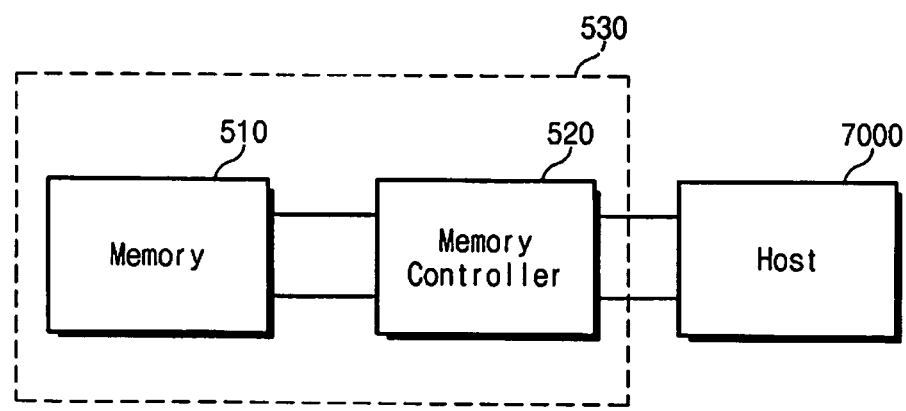
FIG. 35 illustrates an example memory card and host system in accordance with example embodiments.

FIG. 35 illustrates example embodiments in which the host system 7000 is connected to the card 530 of FIG. 33. In example embodiments, the host system 7000 may apply control signals to the card 530 such that the memory controller 520 controls operation of the memory 510.

Figure 36:
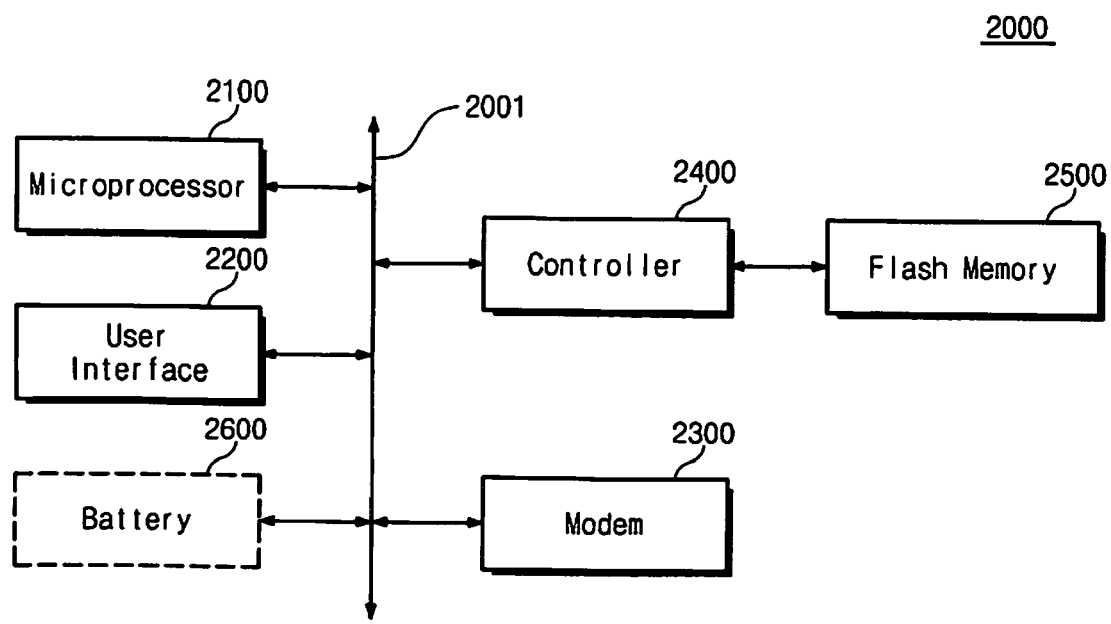
FIG. 36 illustrates an example system in accordance with example embodiments.

FIG. 36 illustrates other example embodiments. As shown, system 2000 may include a microprocessor 2100, user interface 2200, for example, a keypad, a keyboard, and/or a display, modem 2300, controller 2400, memory 2500 and/or battery 2600. In example embodiments, each of the system elements may be combined each other through a bus 2001.

The controller 2400 may also include one or more microprocessors, a digital signal processor, a microcontroller, or any processor similar to the above. The memory 2500 may be used to store data and/or commands executed by the controller 2400. The memory 2500 may be any of any of the memories described in example embodiments above.

The modem 2300 may be used to transmit data to and/or from another system, for example, a communication network. The system 2000 may be part of a mobile system, such as a PDA, a portable computer, web tablet, a wireless phone, a mobile phone, a digital music player, memory card, or other system transmitting and/or receiving information.

Any of the variations and/or alternatives discussed above in conjunction with FIGS. 5A-24 may also be applied to example embodiments illustrated in FIGS. 25-36.

Example embodiments being thus described, it will be obvious that the same may be varied in many ways. Such variations are not to be regarded as a departure from example embodiments, and all such modifications are intended to be included within the scope of append claims.

What is claimed is:

1. A method of programming a nonvolatile memory device having a charge storage layer, comprising:
    performing a programming loop including at least one unit programming loop, each unit programming loop including,
    applying a programming pulse to a word line,
    applying at least one of a time delay to the word line and a soft erase pulse to the nonvolatile memory device, and
    applying a verifying pulse to the word line.

2. The method of claim 1, wherein applying the at least one of the time delay and the soft erase pulse occurs prior to applying the verifying pulse.

3. The method of claim 2, wherein the time delay is applied to the word line.

4. The method of claim 2, wherein the soft erase pulse is applied to the nonvolatile memory device.

5. The method of claim 2, wherein the time delay is applied to the word line and the soft erase pulse is applied to the nonvolatile memory device.

6. The method of claim 2, the programming loop including,
    one unit programming loop including,
        applying the programming pulse to the word line,
        applying the time delay to the word line, and
        applying the verifying pulse to the word line; and
    another unit programming loop including,
        applying another programming pulse to the word line,
        applying the soft erase pulse to the nonvolatile memory device, and
        applying another verifying pulse to the word line.

7. The method of claim 1, wherein applying the verifying pulse occurs prior to applying the at least one of the time delay and the soft erase pulse.

8. The method of claim 7, wherein the time delay is applied to the word line.

9. The method of claim 7, wherein the soft erase pulse is applied to the nonvolatile memory device.

10. The method of claim 7, wherein the time delay is applied to the word line and the soft erase pulse is applied to the nonvolatile memory device.

11. The method of claim 7, the at least one unit programming loop including, one unit programming loop including,
applying the programming pulse to the word line,
applying the verifying pulse to the word line, and
applying the time delay to the word line; and
another unit programming loop including,
applying another programming pulse to the word line,
applying another verifying pulse to the word line, and
applying the soft erase pulse to the nonvolatile memory device.

12. The method of claim 1, wherein the nonvolatile memory device is a charge trap flash memory and the charge storage layer is a charge trap layer.

13. The method of claim 1, wherein the time delay between 1 us to 900 ms.

14. The method of claim 1, wherein the at least one of the time delay and the soft erase pulse redistribute or recombine charge within charge storage layer.

15. The method of claim 1, wherein a voltage of the soft erase pulse is less than a voltage of the programming pulse.

16. The method of claim 1, wherein the programming pulse is generated by applying a positive program voltage to a control gate of the nonvolatile memory device.

17. The method of claim 1, wherein the soft erase pulse is generated by applying a positive erase voltage to a substrate of the nonvolatile memory device.

18. The method of claim 1, wherein the programming pulse and soft erase pulse have the same polarity.

19. The method of claim 1, wherein the programming pulse and soft erase pulse have different polarities.

20. The method of claim 1, wherein the nonvolatile memory device is a NAND flash memory.

21. The method of claim 1, wherein at least one of the amplitude and duration of any one of the programming pulse, the soft erase pulse, and the verifying pulse may vary within the unit programming loop or across unit programming loops.

22. A nonvolatile memory device, comprising:
an array of memory cell transistors connected by a plurality of word lines and a plurality of bit lines; and
programming logic performing at least one unit programming loop, wherein for each unit programming loop, the programming logic
applies a programming pulse to a selected one of the plurality of word lines and a pass
pulse to unselected ones of the plurality of word lines,
applies at least one of a time delay to the selected one of the plurality of word lines and a
soft erase pulse to a substrate of the nonvolatile memory device and
applies a verifying pulse to the selected one of the plurality of word lines and a read pulse to unselected ones of the plurality of word lines.

23. A system, comprising:
a memory including
an array of memory cell transistors connected by a plurality of word lines and a plurality of bit lines, and
programming logic performing at least one unit programming loop,
wherein for each unit programming loop, the programming logic applies a programming pulse to a selected one of the plurality of word lines and a pass pulse to unselected ones of the plurality of word lines, applies at least one of a time delay to the selected one of the plurality of word lines and a soft erase pulse to a substrate of the nonvolatile memory device and applies a verifying pulse to the selected one of the plurality of word lines and a read pulse to unselected ones of the plurality of word lines; and
a memory controller, for controlling the memory.

24. A system, comprising:
a memory including
an array of memory cell transistors connected by a plurality of word lines and a plurality of bit lines, and
programming logic performing at least one unit programming loop,
wherein for each unit programming loop, the programming logic applies a programming pulse to a selected one of the plurality of word lines and a pass pulse to unselected ones of the plurality of word lines, applies at least one of a time delay to the selected one of the plurality of word lines and a soft erase pulse to a substrate of the nonvolatile memory device and applies a verifying pulse to the selected one of the plurality of word lines and a read pulse to unselected ones of the plurality of word lines; and
a controller, for controlling the memory;
a user interface for enabling access to the memory;
a modem permitting information in the memory to be transmitted;
a battery for supplying power to the memory; and
a bus for connecting the memory, the controller, the user interface, the modem and the battery.

25. The method of claim 1, wherein the soft erase pulse is generated by applying a negative erase voltage to the word line.

* * * * *